US012562698B2

(12) United States Patent
Nakagawa et al.

(10) Patent No.: US 12,562,698 B2
(45) Date of Patent: Feb. 24, 2026

(54) RADIO-FREQUENCY MODULE AND COMMUNICATION DEVICE

(71) Applicant: Murata Manufacturing Co., Ltd., Kyoto (JP)

(72) Inventors: Dai Nakagawa, Kyoto (JP); Takanori Uejima, Kyoto (JP); Yuji Takematsu, Kyoto (JP); Isao Takenaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 565 days.

(21) Appl. No.: 18/159,291

(22) Filed: Jan. 25, 2023

(65) Prior Publication Data

US 2023/0170862 A1    Jun. 1, 2023

Related U.S. Application Data

(63) Continuation of application No. PCT/JP2021/028576, filed on Aug. 2, 2021.

(30) Foreign Application Priority Data

Aug. 12, 2020    (JP) ................................ 2020-136488

(51) Int. Cl.
*H03F 3/195*        (2006.01)
*H03F 1/56*         (2006.01)
                    (Continued)

(52) U.S. Cl.
CPC ............. *H03F 3/245* (2013.01); *H03F 1/565* (2013.01); *H05K 1/0243* (2013.01);
                    (Continued)

(58) Field of Classification Search
CPC ........................................................ H03F 3/195
                    (Continued)

(56) References Cited

U.S. PATENT DOCUMENTS 11,611,367 B2 *  3/2023  Miyazaki .................. H03F 3/72
11,621,739 B2 *  4/2023  Matsumoto ............ H03H 9/725
                                                       455/73
                    (Continued)

FOREIGN PATENT DOCUMENTS

JP        H10-125830 A        5/1998
JP        2013-153007 A       8/2013
                    (Continued)

OTHER PUBLICATIONS

International Search Report for PCT/JP2021/028576 dated Oct. 26, 2021.

*Primary Examiner* — Henry Choe
(74) *Attorney, Agent, or Firm* — McDonald Hopkins LLC

(57)                ABSTRACT

Improvement in heat dissipation capability is intended. A radio-frequency module includes a mounting substrate, a plurality of transmission filters, a resin layer, and a shield layer. The mounting substrate has a first major surface and a second major surface opposite to each other. The plurality of transmission filters is mounted on the first major surface of the mounting substrate. The resin layer is disposed on the first major surface of the mounting substrate and covers at least part of an outer peripheral surface of each of the plurality of transmission filters. The shield layer covers the resin layer and at least part of each of the plurality of transmission filters. At least part of a major surface of each of the plurality of transmission filters on an opposite side to the mounting substrate side is in contact with the shield layer.

20 Claims, 15 Drawing Sheets

(51) Int. Cl.
    *H03F 3/24*           (2006.01)
    *H05K 1/02*           (2006.01)

(52) U.S. Cl.
    CPC .. *H03F 2200/165* (2013.01); *H03F 2200/294*
        (2013.01); *H03F 2200/387* (2013.01); *H03F*
                         *2200/451* (2013.01)

(58) Field of Classification Search
    USPC ........................................................ 330/307
    See application file for complete search history.

(56)             References Cited

U.S. PATENT DOCUMENTS

| | | | |
|---|---|---|---|
| 11,658,691 B2 * | 5/2023 | Shinozaki | H01L 25/065 |
| | | | 455/552.1 |
| 12,382,576 B2 * | 8/2025 | Nakagawa | H01L 23/00 |
| 2015/0289419 A1 | 10/2015 | Kouya et al. | |

| | | | |
|---|---|---|---|
| 2017/0250669 A1 | 8/2017 | Kuroyanagi et al. | |
| 2019/0230781 A1 | 7/2019 | Onodera | |
| 2021/0005579 A1 | 1/2021 | Matsumoto | |
| 2021/0099191 A1 | 4/2021 | Uejima | |
| 2022/0021407 A1 * | 1/2022 | Tsuchida | H04B 1/0483 |
| 2023/0262879 A1 * | 8/2023 | Higashi | H04B 1/38 |
| | | | 361/783 |
| 2023/0328877 A1 * | 10/2023 | Yamaguchi | H05K 1/185 |
| | | | 361/761 |
| 2024/0047377 A1 * | 2/2024 | Uejima | H03H 9/25 |

FOREIGN PATENT DOCUMENTS

| | | | |
|---|---|---|---|
| JP | 2014-093446 A | 5/2014 | |
| JP | 2017-157922 A | 9/2017 | |
| WO | 2016/084783 A1 | 6/2016 | |
| WO | 2018/092529 A1 | 5/2018 | |
| WO | 2019/181590 A1 | 9/2019 | |
| WO | 2019/244816 A1 | 12/2019 | |

* cited by examiner

RADIO-FREQUENCY MODULE AND COMMUNICATION DEVICE

CROSS REFERENCE TO RELATED APPLICATION

This is a continuation of International Application No. PCT/JP2021/028576 filed on Aug. 2, 2021 which claims priority from Japanese Patent Application No. 2020-136488 filed on Aug. 12, 2020. The contents of these applications are incorporated herein by reference in their entireties.

BACKGROUND OF THE DISCLOSURE

Field of the Disclosure

The present disclosure generally relates to a radio-frequency module and a communication device and, more specifically, to a radio-frequency module that includes a mounting substrate, and a communication device that includes the radio-frequency module.

Description of the Related Art

Patent Document 1 describes a radio-frequency module. The radio-frequency module includes a mounting substrate having a first major surface and a second major surface opposite to each other, a plurality of transmission filters mounted on the first major surface of the mounting substrate, a resin member covering the plurality of transmission filters, and a shield electrode layer.

In the radio-frequency module described in Patent Document 1, the shield electrode layer is formed so as to cover the top surface and side surface of the resin member.

Patent Document 1 also describes a communication device including a radio-frequency module.

Patent Document 1: International Publication No. 2019/181590

BRIEF SUMMARY OF THE DISCLOSURE

In a radio-frequency module, improvement in heat dissipation capability is desired to suppress an increase in the temperature of the plurality of transmission filters.

It is a possible benefit of the present disclosure to provide a radio-frequency module and a communication device capable of improving the heat dissipation capability.

A radio-frequency module according to an aspect of the present disclosure includes a mounting substrate, a plurality of transmission filters, a resin layer, and a shield layer. The mounting substrate has a first major surface and a second major surface opposite to each other. The plurality of transmission filters is mounted on the first major surface of the mounting substrate. The resin layer is disposed on the first major surface of the mounting substrate and covers at least part of an outer peripheral surface of each of the plurality of transmission filters. The shield layer covers the resin layer and at least part of each of the plurality of transmission filters. At least part of a major surface of each of at least two transmission filters of the plurality of transmission filters on an opposite side to the mounting substrate side is in contact with the shield layer.

A radio-frequency module according to an aspect of the present disclosure includes a mounting substrate, a plurality of transmission filters, a plurality of metal members, a resin layer, and a shield layer. The mounting substrate has a first major surface and a second major surface opposite to each other. The plurality of transmission filters is mounted on the first major surface of the mounting substrate. The plurality of metal members is disposed on a major surface of each of the plurality of transmission filters on an opposite side to the mounting substrate side. The resin layer is disposed on the first major surface of the mounting substrate and covers at least part of an outer peripheral surface of each of the plurality of transmission filters and at least part of an outer peripheral surface of each of the plurality of metal members. The shield layer covers the resin layer and at least part of each of the plurality of metal members. The plurality of metal members is in contact with the shield layer and the major surfaces of corresponding transmission filters of the plurality of transmission filters on an opposite side to the mounting substrate side.

According to an aspect of the present disclosure, a communication device includes the above-described radio-frequency module and a signal processing circuit. The signal processing circuit is connected to the radio-frequency module.

The radio-frequency module and the communication device according to the aspects of the present disclosure are capable of improving the heat dissipation capability.

BRIEF DESCRIPTION OF THE SEVERAL VIEWS OF THE DRAWINGS

Figure 3:
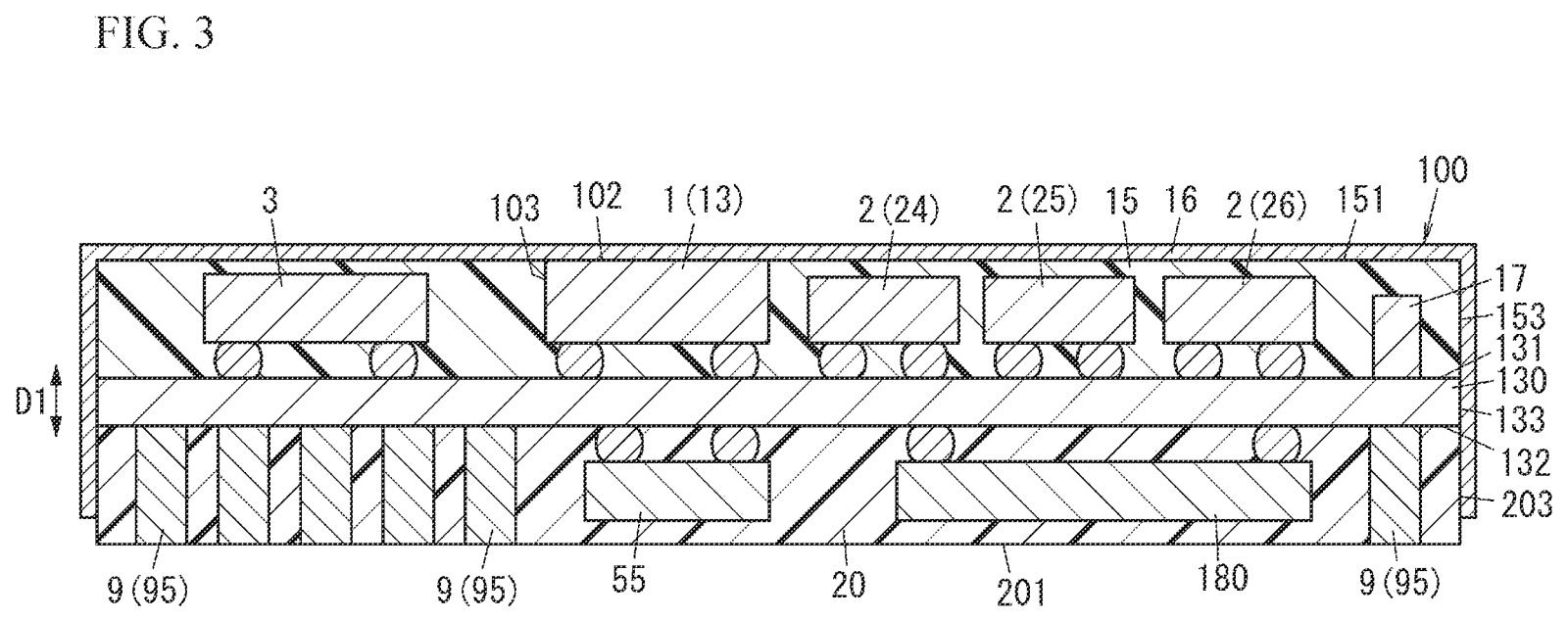

FIG. 3 is a cross-sectional view of the radio-frequency module, taken along the line X-X in FIG. 1.

Figure 4:
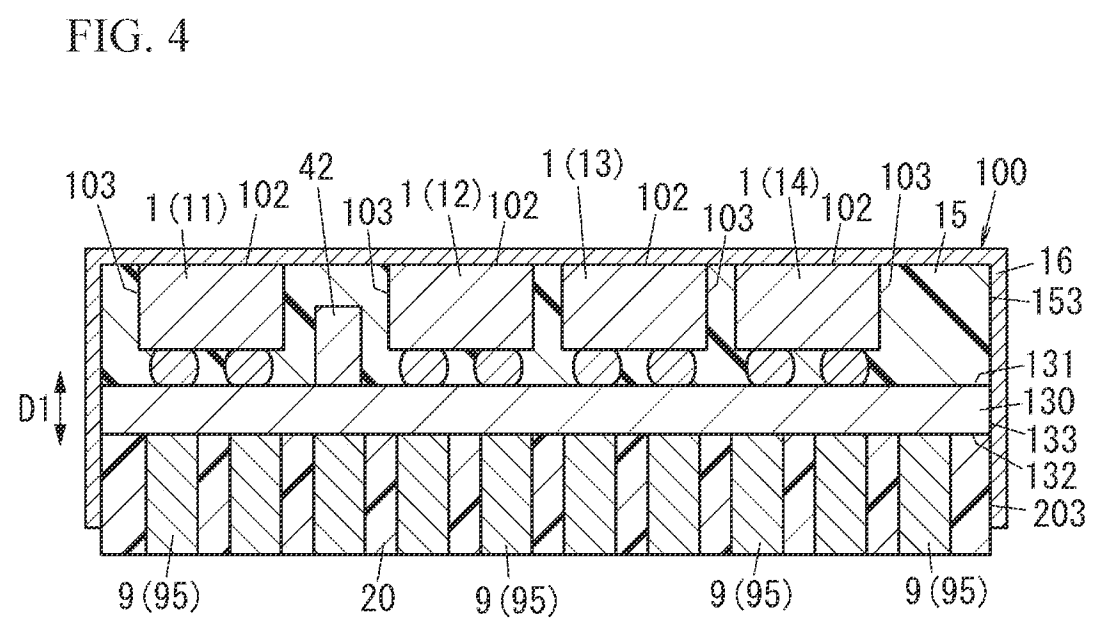

FIG. 4 is a cross-sectional view of the radio-frequency module, taken along the line Y-Y in FIG. 1.

FIG. 9 is a circuit diagram of a power amplifier and part of the output matching circuit of the radio-frequency module.

FIG. 10 is a cross-sectional view of a radio-frequency module according to a first modification of the first embodiment.

FIG. 12 is a cross-sectional view of a radio-frequency module according to a third modification of the first embodiment.

US 12,562,698 B2

Figure 15:
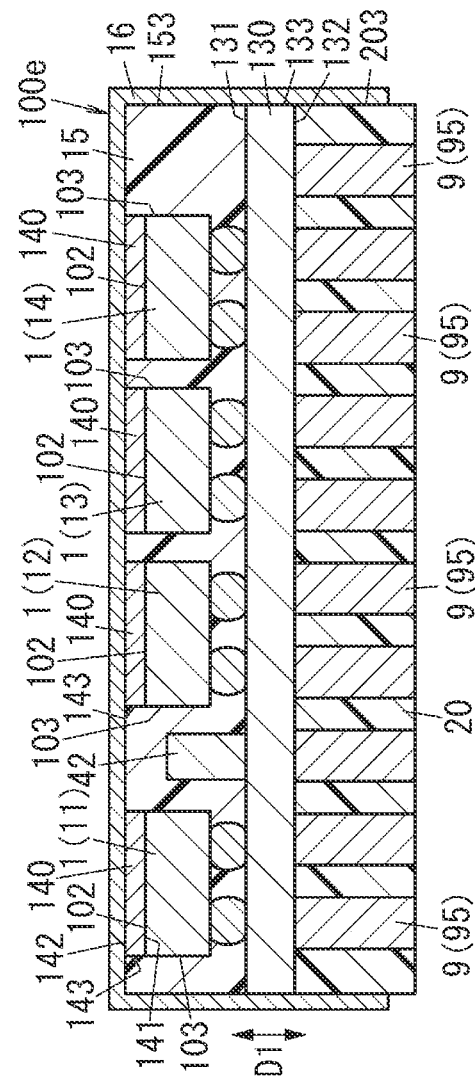

FIG. 15 is a cross-sectional view of a radio-frequency module according to a second embodiment.

DETAILED DESCRIPTION OF THE DISCLOSURE

FIGS. 1 to 7, and 10 to 15 that will be referenced in the following embodiments and the like all are schematic diagrams, and the ratios of the sizes and thicknesses of component elements in the drawings do not always reflect actual scale ratios.

First Embodiment

For example, as shown in FIGS. 1 to 5, a radio-frequency module 100 according to the first embodiment includes a mounting substrate 130, a plurality of (for example, four) transmission filters 1, a resin layer 15, and a shield layer 16. The mounting substrate 130 has a first major surface 131 and a second major surface 132 opposite to each other. The plurality of transmission filters 1 is mounted on the first major surface 131 of the mounting substrate 130. The resin layer 15 is disposed on the first major surface 131 of the mounting substrate 130 and covers an outer peripheral surface 103 of each of the plurality of transmission filters 1. The shield layer 16 covers the resin layer 15 and the plurality of transmission filters 1.

Hereinafter, the radio-frequency module 100 and a communication device 300 according to the first embodiment will be described in more detail with reference to FIGS. 1 to 9.

Figure 8:
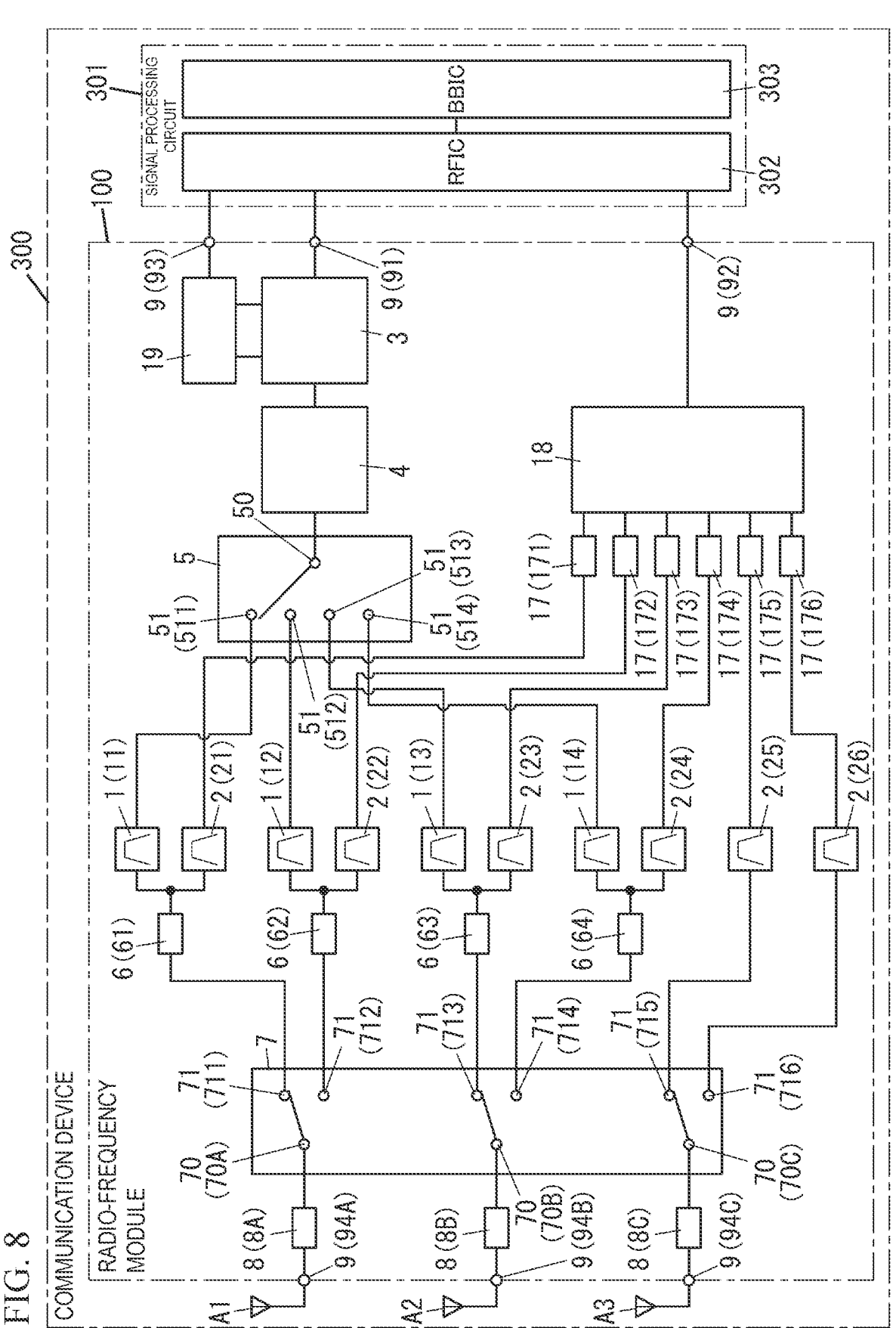
FIG. 8 is a circuit configuration diagram of a communication device that includes the radio-frequency module.

(1) Radio-Frequency Module and Communication Device
(1.1) Circuit Configuration of Radio-Frequency Module and Communication Device As shown in FIG. 8, the radio-frequency module 100 is used in, for example, the communication device 300. The communication device 300 is, for example, a mobile phone (for example, a smartphone); however, the configuration is not limited thereto. The communication device 300 may be, for example, a wearable terminal (for example, a smart watch) or the like. The radio-frequency module 100 is, for example, a module that supports a fourth generation mobile communication (4G) standard, a fifth generation mobile communication (5G) standard, and the like. The 4G standard is, for example, a 3GPP (Third Generation Partnership Project) LTE (Long Term Evolution) standard. The 5G standard is, for example, 5G NR (New Radio). The radio-frequency module 100 is a module that supports, for example, carrier aggregation and dual connectivity.

The radio-frequency module 100 is, for example, configured to be capable of amplifying a transmission signal (radio-frequency signal) in a first frequency band (for example, 600 MHz to 900 MHz, 1.7 GHz to 2 GHz, 2.3 GHz to 2.7 GHz, or the like) inputted from the signal processing circuit 301 and outputting the transmission signal to an antenna A1 (hereinafter, also referred to as first antenna A1). The radio-frequency module 100 is configured to be capable of amplifying a transmission signal (radio-frequency signal) in a second frequency band (for example, 600 MHz to 900 MHz, 1.7 GHz to 2 GHz, 2.3 GHz to 2.7 GHz, or the like) inputted from the signal processing circuit 301 and outputting the transmission signal from an antenna A2 (hereinafter, also referred to as second antenna A2). The radio-frequency module 100 further includes a low-noise amplifier 18. The radio-frequency module 100 is configured to be capable of amplifying a reception signal (radio-frequency signal) in the first frequency band inputted from the first antenna A1 and outputting the reception signal to the signal processing circuit 301. The radio-frequency module 100 is configured to be capable of amplifying a reception signal (radio-frequency signal) in the second frequency band inputted from the second antenna A2 and outputting the reception signal to the signal processing circuit 301. The radio-frequency module 100 is configured to be capable of amplifying a reception signal (radio-frequency signal) in a third frequency band (for example, 600 MHz to 900 MHz, 1.7 GHz to 2 GHz, 2.3 GHz to 2.7 GHz, or the like) inputted from a third antenna A3 and outputting the reception signal to the signal processing circuit 301. The signal processing circuit 301 is not a component element of the radio-frequency module 100 but a component element of the communication device 300 that includes the radio-frequency module 100. The radio-frequency module 100 is, for example, controlled by the signal processing circuit 301 of the communication device 300. The communication device 300 includes the radio-frequency module 100 and the signal processing circuit 301. The communication device 300 further includes the first antenna A1, the second antenna A2, and the third antenna A3. The communication device 300 further includes a circuit board on or in which the radio-frequency module 100 is mounted. The circuit board is, for example, a printed circuit board. The circuit board has a ground electrode to which a ground potential is applied.

The signal processing circuit 301 includes, for example, an RF signal processing circuit 302 and a baseband signal processing circuit 303. The RF signal processing circuit 302 is, for example, a radio frequency integrated circuit (RFIC), and performs signal processing on a radio-frequency signal. The RF signal processing circuit 302, for example, performs signal processing on a radio-frequency signal (transmission signal) outputted from the baseband signal processing circuit 303 by up conversion, or the like and outputs the processed radio-frequency signal. The RF signal processing circuit 302, for example, performs signal processing on a radio-frequency signal (reception signal) outputted from the radio-frequency module 100 by down conversion or the like and outputs the processed radio-frequency signal to the baseband signal processing circuit 303. The baseband signal processing circuit 303 is, for example, a baseband integrated circuit (BBIC). The baseband signal processing circuit 303 generates an I-phase signal and a Q-phase signal from a baseband signal. The baseband signal is, for example, an audio signal, an image signal, or the like inputted from the outside. The baseband signal processing circuit 303 performs IQ modulation process by synthesizing the I-phase signal with the Q-phase signal and outputs a transmission signal. At this time, the transmission signal is generated as a modulation signal (IQ signal) obtained by modulating the amplitude of a carrier wave signal with a predetermined frequency at a period longer than the period of the carrier wave signal. A reception signal processed by the baseband signal processing circuit 303 is, for example, used to display an image as an image signal or for a user of the communication device 300 to call as a voice signal. The radio-frequency module 100 transmits a radio-frequency signal (a reception signal or a transmission signal) between each of the first antenna A1 and the second antenna A2 and the RF signal processing circuit 302 of the signal processing circuit 301. The radio-frequency module 100 transmits a radio-frequency signal (reception signal) between the third antenna A3 and the RF signal processing circuit 302 of the signal processing circuit 301.

The radio-frequency module 100 includes the plurality of (for example, four) transmission filters 1. The radio-frequency module 100 includes the power amplifier 3 and the output matching circuit 4. The radio-frequency module 100 includes a plurality of (for example, six) receiving filters 2. The radio-frequency module 100 includes the low-noise amplifier 18 and a plurality of (for example, six) input matching circuits 17. The radio-frequency module 100 includes a switch 7 (hereinafter, also referred to as first switch) and a second switch 5. The radio-frequency module 100 further includes a controller 19. The radio-frequency module 100 includes a plurality of (for example, four) matching circuits 6 connected between the first switch 7 and the plurality of transmission filters 1. The radio-frequency module 100 includes a plurality of (for example, three) matching circuits 8 connected between the first switch 7 and a plurality of (for example, three) antenna terminals 94A, 94B, 94C.

The transmission filters 1 respectively have pass bands different from one another. Hereinafter, when the four transmission filters 1 are described separately, the four transmission filters 1 may also be respectively referred to as a first transmission filter 11, a second transmission filter 12, a third transmission filter 13, and a fourth transmission filter 14. The receiving filters 2 respectively have pass bands different from one another. Hereinafter, when the six receiving filters 2 are described separately, the six receiving filters 2 may also be respectively referred to as a first receiving filter 21, a second receiving filter 22, a third receiving filter 23, a fourth receiving filter 24, a fifth receiving filter 25, and a sixth receiving filter 26.

The radio-frequency module 100 includes a plurality of external connection terminals 9. The plurality of external connection terminals 9 includes a signal input terminal 91, a signal output terminal 92, a control terminal 93, the plurality of (for example, three) antenna terminals 94A, 94B, 94C, and a plurality of ground terminals 95 (see FIGS. 2 to 4). The plurality of ground terminals 95 is terminals electrically connected to the ground electrode of the circuit board of the communication device 300 and applied with a ground potential.

The first transmission filter 11 is, for example, a filter that has a transmission band of a first communication band as a pass band. The second transmission filter 12 is, for example, a filter that has a transmission band of a second communication band as a pass band. The third transmission filter 13 is, for example, a filter that has a transmission band of a third communication band as a pass band. The fourth transmission filter 14 is, for example, a filter that has a transmission band of a fourth communication band as a pass band. The first communication band is associated with a transmission signal that passes through the first transmission filter 11 and is, for example, 3GPP LTE standard Band 1. The second communication band is associated with a transmission signal that passes through the second transmission filter 12 and is, for example, 3GPP LTE standard Band 3. The third communication band is associated with a transmission signal that passes through the third transmission filter 13 and is, for example, 5G NR standard n1. The fourth communication band is associated with a transmission signal that passes through the fourth transmission filter 14 and is, for example, 5G NR standard n41.

The power amplifier 3 has an input terminal and an output terminal. The power amplifier 3 amplifies transmission signals in the first frequency band and the second frequency band, inputted to the input terminal, and outputs the transmission signals from the output terminal. Here, the first frequency band includes, for example, the first communication band and the second communication band. The second frequency band includes, for example, the third communication band and the fourth communication band. The input terminal of the power amplifier 3 is connected to the signal input terminal 91. The input terminal of the power amplifier 3 is connected to the signal processing circuit 301 via the signal input terminal 91. The signal input terminal 91 is a terminal for inputting a radio-frequency signal (transmission signal) from an external circuit (for example, the signal processing circuit 301) to the radio-frequency module 100. The output terminal of the power amplifier 3 is connected to the common terminal 50 of the second switch 5 via the output matching circuit 4.

Figure 9:
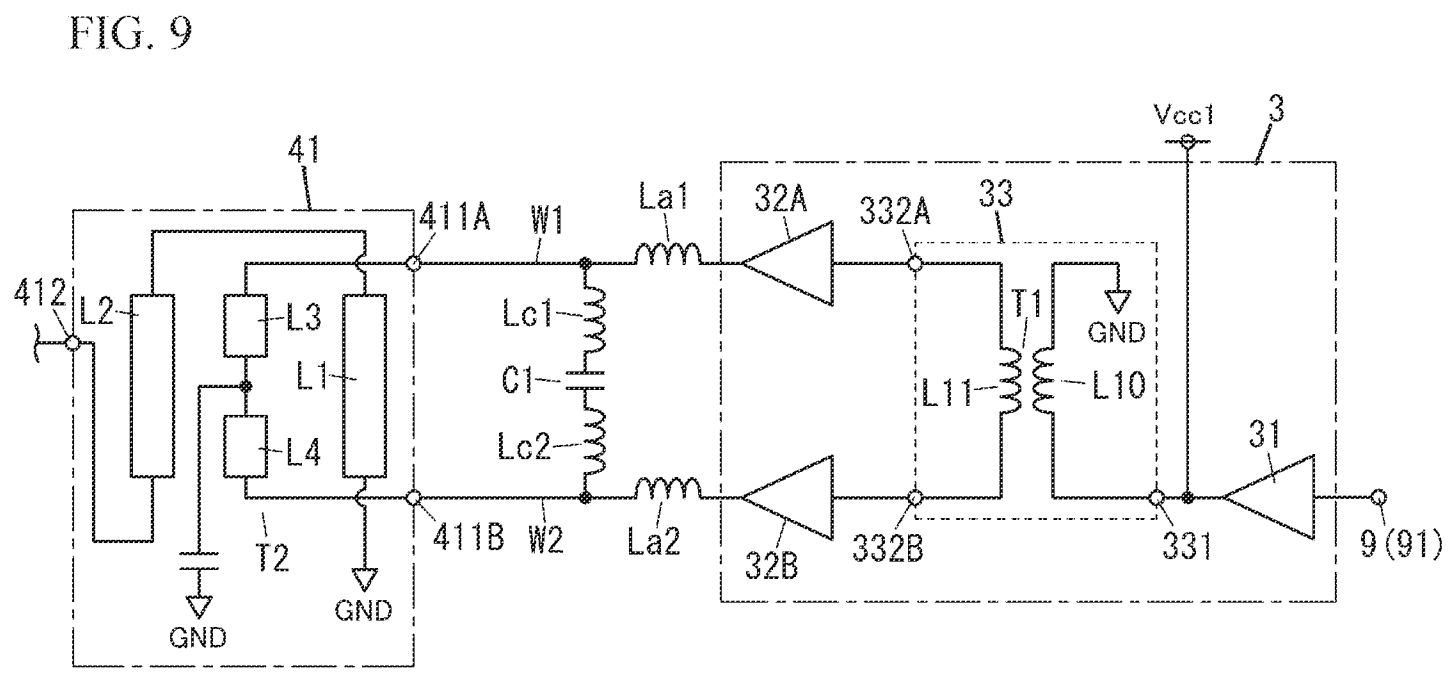

For example, as shown in FIG. 9, the power amplifier 3 includes a driver stage amplifier 31, two final stage amplifiers 32A, 32B, and an unbalance-balance conversion circuit 33 (hereinafter, referred to as first balun 33) including a first transformer T1. Each of the driver stage amplifier 31, the final stage amplifier 32A, and the final stage amplifier 32B includes an amplifier transistor. The first transformer T1 includes a primary inductor L10 and a secondary inductor L11. The first balun 33 has an unbalanced terminal 331 and a pair of balanced terminals 332A, 332B. The primary inductor L10 is connected between the unbalanced terminal 331 and a ground. The secondary inductor L11 is connected between the balanced terminal 332A and the balanced terminal 332B. In the power amplifier 3, the input terminal of the driver stage amplifier 31 is connected to the signal input terminal 91, the output terminal of the driver stage amplifier 31 is connected to the unbalanced terminal 331, the input terminal of the final stage amplifier 32A is connected to the balanced terminal 332A, and the input terminal of the final stage amplifier 32B is connected to the balanced terminal 332B. In the power amplifier 3, the input terminal of the driver stage amplifier 31 is an input terminal of the power amplifier 3, and the output terminal of each of the two final stage amplifiers 32A, 32B is an output terminal of the power amplifier 3. The power amplifier 3 makes up a differential amplifier circuit. A voltage Vcc1 is applied to the output terminal of the driver stage amplifier 31.

As shown in FIG. 8, the output matching circuit 4 is provided in a signal path between the output terminal of the power amplifier 3 and the common terminal 50 of the second switch 5. The output matching circuit 4 is a circuit for matching the impedance between the power amplifier 3 and the plurality of transmission filters 1. As shown in FIG. 9, the output matching circuit 4 includes, for example, a balance-unbalance conversion circuit 41 (hereinafter referred to as second balun 41) having a second transformer T2, and a plurality of circuit elements 42 (see FIG. 1). The plurality of circuit elements 42 includes an inductor L42 (see FIGS. 1 and 7). The second balun 41 has a pair of balanced terminals 411A, 411B and an unbalanced terminal 412. In the output matching circuit 4, the balanced terminal 411A is connected to the output terminal of the final stage amplifier 32A, the balanced terminal 411B is connected to the output terminal of the final stage amplifier 32B, and the unbalanced terminal 412 is connected to the common terminal 50 of the second switch 5 (see FIG. 8). The second transformer T2 has, for example, four inductor elements L1, L2, L3, L4. In the second transformer T2, a primary inductor is made up of a series circuit of the inductor element L3 and the inductor element L4, and a secondary inductor is made up of a series circuit of the inductor element L1 and the inductor element L2. In the second transformer T2, the primary inductor is connected between the balanced terminal 411A and the balanced terminal 411B.

The radio-frequency module 100 further includes a series circuit connected between a wire W1 connecting the output terminal of the final stage amplifier 32A with the balanced terminal 411A and a wire W2 connecting the output terminal of the final stage amplifier 32B with the balanced terminal 411B. This series circuit includes an inductor Lc1, a capacitor C1, and an inductor Lc2 and is not grounded to a ground. This series circuit is an LC resonant circuit for attenuating an odd-ordered harmonic (for example, a third-order harmonic) of a radio-frequency signal (transmission signal) inputted to the power amplifier 3. The resonant frequency of the LC resonant circuit is included in a frequency band between a frequency three times the lower limit of a relatively low frequency-side frequency band of the first frequency band and the second frequency band and a frequency three times the upper limit of a relatively high frequency-side frequency band of the first frequency band and the second frequency band. The radio-frequency module 100 further includes an inductor La1 connected between the output terminal of the final stage amplifier 32A and the balanced terminal 411A and an inductor La2 connected between the output terminal of the final stage amplifier 32B and the balanced terminal 411B.

The first receiving filter 21 is, for example, a filter that has a receiving band of the first communication band as a pass band. The second receiving filter 22 is, for example, a filter that has a receiving band of the second communication band as a pass band. The third receiving filter 23 is, for example, a filter that has a receiving band of the third communication band as a pass band. The fourth receiving filter 24 is, for example, a filter that has a receiving band of the fourth communication band as a pass band. The fifth receiving filter 25 is, for example, a filter that has a receiving band of the fifth communication band as a pass band. The sixth receiving filter 26 is, for example, a filter that has a receiving band of the sixth communication band as a pass band. The first communication band is associated with a reception signal that passes through the first receiving filter 21 and is, for example, 3GPP LTE standard Band 1. The second communication band is associated with a reception signal that passes through the second receiving filter 22 and is, for example, 3GPP LTE standard Band 3. The third communication band is associated with a reception signal that passes through the third receiving filter 23 and is, for example, 5G NR standard n1. The fourth communication band is associated with a reception signal that passes through the fourth receiving filter 24 and is, for example, 5G NR standard n41. The fifth communication band is associated with a reception signal that passes through the fifth receiving filter 25 and is, for example, 5G NR standard n3. The sixth communication band is associated with a reception signal that passes through the sixth receiving filter 26 and is, for example, 3GPP LTE standard Band 7.

The low-noise amplifier 18 amplifies input reception signals in the first frequency band, the second frequency band, and the third frequency band and outputs the reception signals. The first frequency band includes, for example, the first communication band and the second communication band. The second frequency band includes, for example, the third communication band and the fourth communication band. The third frequency band includes, for example, the fifth communication band and the sixth communication band.

The low-noise amplifier 18 includes a plurality of (for example, six) amplifier transistors. Each of the plurality of amplifier transistors has an input terminal and an output terminal. The low-noise amplifier 18 amplifies a reception signal inputted to the input terminal of any one amplifier transistor of the plurality of amplifier transistors and outputs the reception signal from the output terminal. The input terminal of each of the plurality of (six) amplifier transistors of the low-noise amplifier 18 is connected to a corresponding one of the plurality of receiving filters 2 via a corresponding one of the plurality of (six) input matching circuits 17. The output terminal of the low-noise amplifier 18 is connected to the signal output terminal 92. The output terminal of the low-noise amplifier 18 is, for example, connected to the signal processing circuit 301 via the signal output terminal 92. The signal output terminal 92 is a terminal for outputting a radio-frequency signal (reception signal) from the low-noise amplifier 18 to an external circuit (for example, the signal processing circuit 301).

The plurality of (for example, six) input matching circuits 17 is provided in a plurality of signal paths between the input terminals of the plurality of amplifier transistors of the low-noise amplifier 18 and the plurality of receiving filters 2. Hereinafter, when the six input matching circuits 17 are described separately, the six input matching circuits 17 may also be respectively referred to as a first input matching circuit 171, a second input matching circuit 172, a third input matching circuit 173, a fourth input matching circuit 174, a fifth input matching circuit 175, and a sixth input matching circuit 176.

The first input matching circuit 171 is a circuit for matching the impedance between the low-noise amplifier 18 and the first receiving filter 21. The second input matching circuit 172 is a circuit for matching the impedance between the low-noise amplifier 18 and the second receiving filter 22. The third input matching circuit 173 is a circuit for matching the impedance between the low-noise amplifier 18 and the third receiving filter 23. The fourth input matching circuit 174 is a circuit for matching the impedance between the low-noise amplifier 18 and the fourth receiving filter 24. The fifth input matching circuit 175 is a circuit for matching the impedance between the low-noise amplifier 18 and the fifth receiving filter 25. The sixth input matching circuit 176 is a circuit for matching the impedance between the low-noise amplifier 18 and the sixth receiving filter 26. Each of the plurality of input matching circuits 17 is made up of, for example, one inductor; however, the configuration is not limited thereto. Each of the plurality of input matching circuits 17 may include, for example, a plurality of inductors and a plurality of capacitors.

The first switch 7 has three common terminals 70 and a plurality of (for example, six) selection terminals 71. Hereinafter, when the three common terminals 70 are described separately, the three common terminals 70 may also be respectively referred to as a common terminal 70A, a common terminal 70B, and a common terminal 70C. Hereinafter, when the six selection terminals 71 are described separately, the six selection terminals 71 may also be respectively referred to as a selection terminal 711, a selection terminal 712, a selection terminal 713, a selection terminal 714, a selection terminal 715, and a selection terminal 716.

The common terminal 70A is connected to the antenna terminal 94A. The antenna A1 is connected to the antenna terminal 94A. The common terminal 70B is connected to the antenna terminal 94B. The antenna A2 is connected to the antenna terminal 94B. The common terminal 70C is connected to the antenna terminal 94C. The antenna A3 is connected to the antenna terminal 94C. The selection terminal 711 is connected to a junction point between the output terminal of the first transmission filter 11 and the input terminal of the first receiving filter 21. The selection terminal 712 is connected to a junction point between the output terminal of the second transmission filter 12 and the input terminal of the second receiving filter 22. The selection terminal 713 is connected to a junction point between the output terminal of the third transmission filter 13 and the input terminal of the third receiving filter 23. The selection terminal 714 is connected to a junction point between the output terminal of the fourth transmission filter 14 and the input terminal of the fourth receiving filter 24. The selection terminal 715 is connected to the input terminal of the fifth receiving filter 25. The selection terminal 716 is connected to the input terminal of the sixth receiving filter 26. The first switch 7 is, for example, allowed to connect at least one of the plurality of selection terminals 711, 712 to the common terminal 70A. The first switch 7 is allowed to connect at least one of the plurality of selection terminals 713, 714 to the common terminal 70B. The first switch 7 is allowed to connect at least one of the plurality of selection terminals 715, 716 to the common terminal 70C. Here, the first switch 7 is, for example, a switch capable of one-to-one connection and one-to-multiple connection.

The first switch 7 is controlled by, for example, the signal processing circuit 301. The first switch 7 switches the connection status between the plurality of common terminals 70 and the plurality of selection terminals 71 in accordance with a control signal from the RF signal processing circuit 302 of the signal processing circuit 301. The first switch 7 is, for example, a switch integrated circuit (IC).

The second switch 5 has a common terminal 50 and a plurality of (for example, four) selection terminals 51. Hereinafter, when the four selection terminals 51 are described separately, the four selection terminals 51 may also be respectively referred to as a selection terminal 511, a selection terminal 512, a selection terminal 513, and a selection terminal 514.

The common terminal 50 is connected to the output terminal of the power amplifier 3 via the output matching circuit 4. The selection terminal 511 is connected to the input terminal of the first transmission filter 11. The selection terminal 512 is connected to the input terminal of the second transmission filter 12. The selection terminal 513 is connected to the input terminal of the third transmission filter 13. The selection terminal 514 is connected to the input terminal of the fourth transmission filter 14. The second switch 5 is, for example, a switch allowed to connect at least one of the plurality of selection terminals 51 to the common terminal 50. Here, the second switch 5 is, for example, a switch capable of one-to-one connection and one-to-multiple connection.

The second switch 5 is controlled by, for example, the signal processing circuit 301. The second switch 5 switches the connection status between the common terminal 50 and the plurality of selection terminals 51 in accordance with a control signal from the RF signal processing circuit 302 of the signal processing circuit 301. The second switch 5 is, for example, a switch IC.

Hereinafter, when the four matching circuits 6 are described separately, the four matching circuits 6 may also be respectively referred to as a matching circuit 61, a matching circuit 62, a matching circuit 63, and a matching circuit 64.

The matching circuit 61 is connected between the selection terminal 711 of the first switch 7 and the junction point between the output terminal of the first transmission filter 11 and the input terminal of the first receiving filter 21. The matching circuit 62 is connected between the selection terminal 712 of the first switch 7 and the junction point between the output terminal of the second transmission filter 12 and the input terminal of the second receiving filter 22. The matching circuit 63 is connected between the selection terminal 713 of the first switch 7 and the junction point between the output terminal of the third transmission filter 13 and the input terminal of the third receiving filter 23. The matching circuit 64 is connected between the selection terminal 714 of the first switch 7 and the junction point between the output terminal of the fourth transmission filter 14 and the input terminal of the fourth receiving filter 24. Each of the plurality of matching circuits 6 is made up of, for example, one inductor; however, the configuration is not limited thereto. Each of the plurality of matching circuits 6 may include, for example, a plurality of inductors and a plurality of capacitors.

Hereinafter, when the three matching circuits 8 are described separately, the three matching circuits 8 may also be respectively referred to as a matching circuit 8A, a matching circuit 8B, and a matching circuit 8C.

The matching circuit 8A is connected between the antenna terminal 94A and the common terminal 70A of the first switch 7. The matching circuit 8B is connected between the antenna terminal 94B and the common terminal 70B of the first switch 7. The matching circuit 8C is connected between the antenna terminal 94C and the common terminal 70C of the first switch 7. Each of the plurality of matching circuits 8 is made up of, for example, one inductor; however, the configuration is not limited thereto. Each of the plurality of matching circuits 8 may include, for example, a plurality of inductors and a plurality of capacitors.

The controller 19 is connected to the control terminal 93. The control terminal 93 is connected to, for example, the signal processing circuit 301. The controller 19 controls the power amplifier 3 in accordance with a control signal from the signal processing circuit 301.

(1.2) Structure of Radio-Frequency Module

As shown in FIGS. 1 to 5, the radio-frequency module 100 includes the mounting substrate 130 and the four transmission filters 1. The radio-frequency module 100 includes the power amplifier 3 and the output matching circuit 4. The radio-frequency module 100 includes the six receiving filters 2, the low-noise amplifier 18, the six input matching circuits 17, the first switch 7, the second switch 5, and the controller 19. The radio-frequency module 100 includes the four matching circuits 6 (hereinafter, also referred to as first matching circuits 6) and the three matching circuits 8 (hereinafter, also referred to as second matching circuits 8). The radio-frequency module 100 further includes the plurality of external connection terminals 9.

The mounting substrate 130 has the first major surface 131 and the second major surface 132 opposite to each other in the thickness direction D1 of the mounting substrate 130. The mounting substrate 130 is, for example, a multilayer substrate that includes a plurality of dielectric layers and a plurality of electrically conductive layers. The plurality of dielectric layers and the plurality of electrically conductive layers are laminated in the thickness direction D1 of the mounting substrate 130. The plurality of electrically conductive layers each is formed in a predetermined pattern determined layer by layer. Each of the plurality of electrically conductive layers includes one or more conductor portions in a plane orthogonal to the thickness direction D1 of the mounting substrate 130. The material of each electrically conductive layer is, for example, copper. The plurality of electrically conductive layers includes a ground layer. In the radio-frequency module 100, the plurality of ground terminals 95 and the ground layer are electrically connected with a via conductor or the like of the mounting substrate 130, interposed therebetween. The mounting substrate 130 is, for example, a low temperature co-fired ceramics (LTCC) substrate. The mounting substrate 130 is not limited to an LTCC substrate. The mounting substrate 130 may be, for example, a printed circuit board, a high temperature co-fired ceramics (HTCC) substrate, or a resin multilayer substrate.

The mounting substrate 130 is not limited to an LTCC substrate and may be, for example, a wiring structure. The wiring structure is, for example, a multilayer structure. The multilayer structure includes at least one electrically insulating layer and at least one electrically conductive layer. The electrically insulating layer is formed in a predetermined pattern. When the number of the electrically insulating layers is multiple, each of the multiple electrically insulating layers is formed in a predetermined pattern determined layer by layer. The electrically conductive layer is formed in a predetermined pattern different from the predetermined pattern of the electrically insulating layer. When the number of the electrically conductive layers is multiple, each of the multiple electrically conductive layers is formed in a predetermined pattern determined layer by layer. The electrically conductive layer may include one or more rewiring portions. In the wiring structure, of two surfaces opposite to each other in the thickness direction of the multilayer structure, a first surface is the first major surface 131 of the mounting substrate 130, and a second surface is the second major surface 132 of the mounting substrate 130. The wiring structure may be, for example, an interposer. The interposer may be an interposer using a silicon substrate or may be a substrate made up of multiple layers.

The first major surface 131 and the second major surface 132 of the mounting substrate 130 are spaced apart in the thickness direction D1 of the mounting substrate 130 and intersect with the thickness direction D1 of the mounting substrate 130. The first major surface 131 of the mounting substrate 130 is, for example, orthogonal to the thickness direction D1 of the mounting substrate 130. The first major surface 131 may include, for example, the side surface or the like of the conductor portion as a surface not orthogonal to the thickness direction D1. The second major surface 132 of the mounting substrate 130 is, for example, orthogonal to the thickness direction D1 of the mounting substrate 130. The second major surface 132 may include, for example, the side surface or the like of the conductor portion as a surface not orthogonal to the thickness direction D1. The first major surface 131 and the second major surface 132 of the mounting substrate 130 may have minute irregularities or a recessed portion or a protruding portion. When, for example, the first major surface 131 of the mounting substrate 130 has a recessed portion, the inner surface of the recessed portion is included in the first major surface 131.

Figure 1:
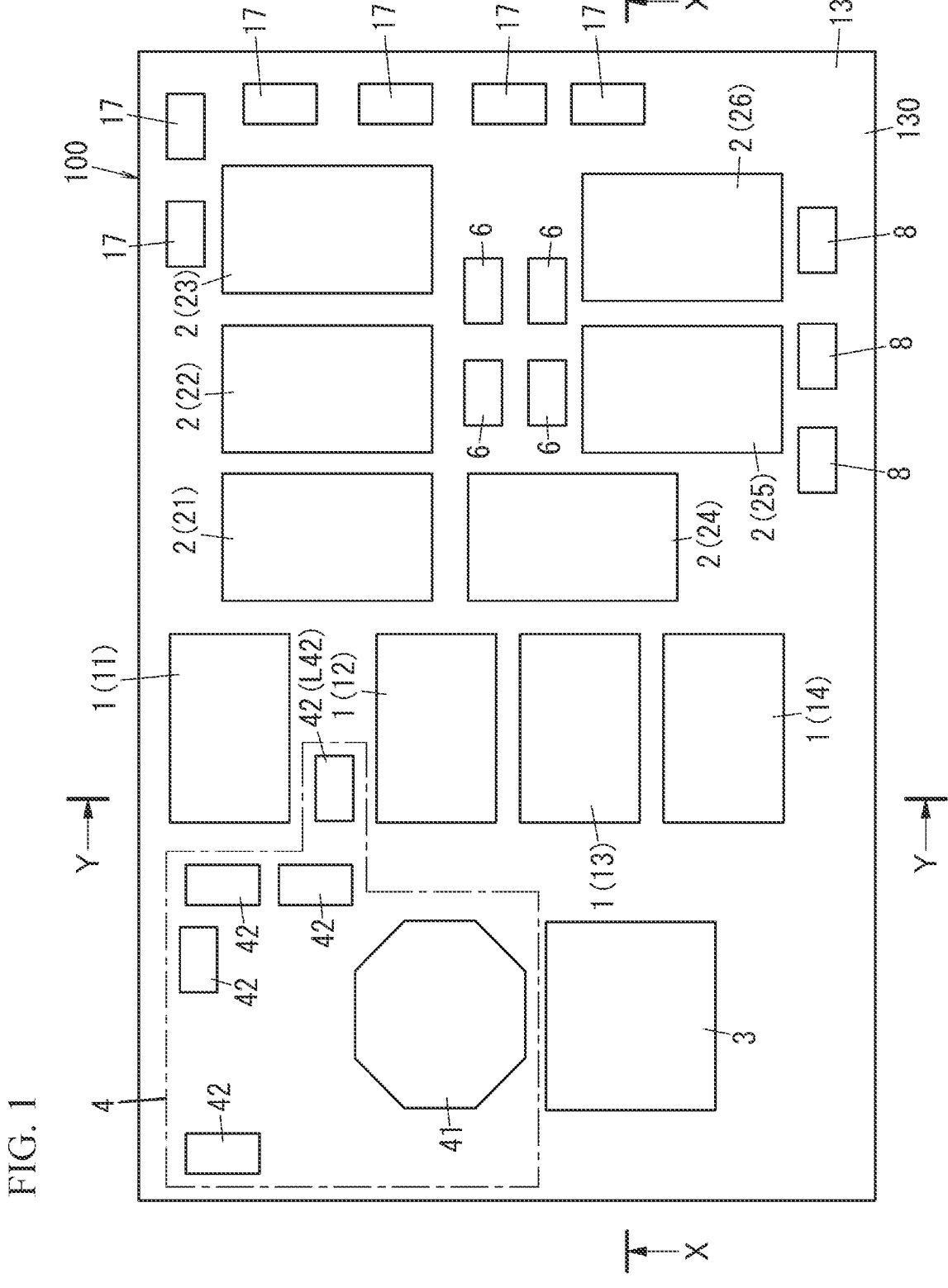
FIG. 1 is a plan view of a radio-frequency module according to a first embodiment.

In the radio-frequency module 100 according to the first embodiment, the circuit components of a first group are mounted on the first major surface 131 of the mounting substrate 130. As shown in FIG. 1, the circuit components of the first group include the four transmission filters 1, the six receiving filters 2, the power amplifier 3, five circuit elements 42 of the output matching circuit 4, the six input matching circuits 17, the six first matching circuits 6, and the three second matching circuits 8. The phrase "the circuit components are mounted on the first major surface 131 of the mounting substrate 130" includes not only a structure that the circuit components are disposed on (mechanically connected to) the first major surface 131 of the mounting substrate 130 but also the circuit components are electrically connected to (appropriate conductor portions of) the mounting substrate 130. In the radio-frequency module 100, the circuit components of a second group of the plurality of circuit components are mounted on the second major surface 132 of the mounting substrate 130. The circuit components of the second group include the first switch 7, the second switch 5, the controller 19, and the low-noise amplifier 18. The phrase "the circuit components are mounted on the second major surface 132 of the mounting substrate 130" includes not only a structure that the circuit components are disposed on (mechanically connected to) the second major surface 132 of the mounting substrate 130 but also the circuit components are electrically connected to (appropriate conductor portions of) the mounting substrate 130. The second balun 41 of the output matching circuit 4 is provided on the mounting substrate 130.

Each of the four transmission filters 1 is, for example, a ladder filter and has a plurality of (for example, four) series arm resonators and a plurality of (for example, three) parallel arm resonators. Each of the four transmission filters 1 is, for example, an acoustic wave filter. The acoustic wave filter is configured such that each of a plurality of series arm resonators and a plurality of parallel arm resonators is made up of an acoustic wave resonator. The acoustic wave filter is, for example, a surface acoustic wave filter that uses surface acoustic waves.

In the surface acoustic wave filter, each of the plurality of series arm resonators and the plurality of parallel arm resonators is, for example, a surface acoustic wave (SAW) resonator.

Figure 5:
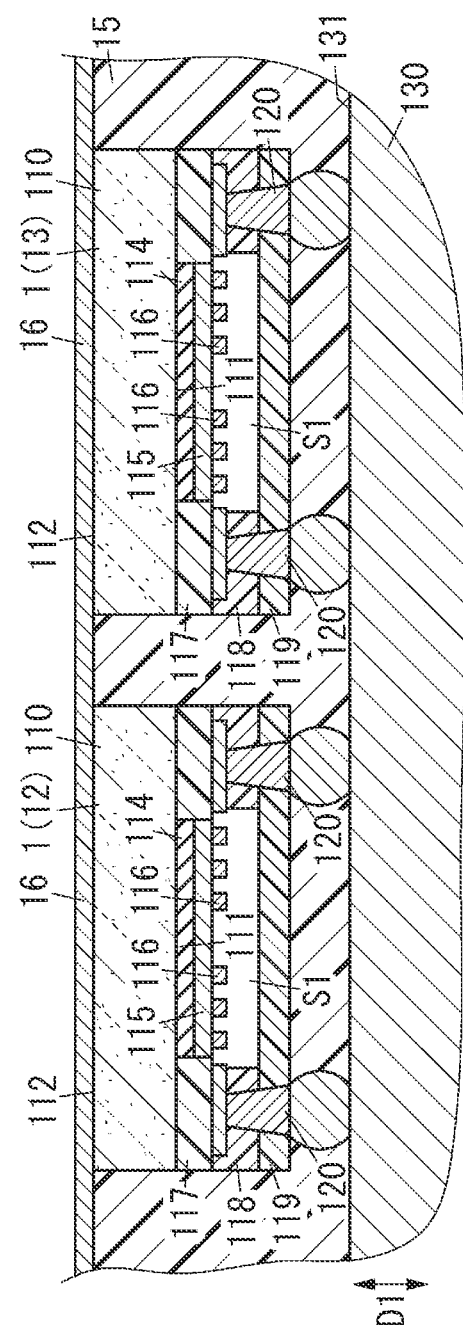
FIG. 5 is a partially enlarged cross-sectional view of the radio-frequency module.

For example, as shown in FIG. 5, each of the plurality of transmission filters 1 includes a substrate 110, a low acoustic velocity film 114 provided on the substrate 110, a piezoelectric layer 115 provided on the low acoustic velocity film 114, and a plurality of interdigital transducer electrodes 116 provided on the piezoelectric layer 115. Each of the plurality of transmission filters 1 includes a spacer layer 118, a cover member 119, and a plurality of terminals 120 as the component elements of a package structure. Each of the plurality of transmission filters 1 has a rectangular shape in plan view in the thickness direction D1 of the mounting substrate 130; however, the configuration is not limited thereto. Alternatively, each of the plurality of transmission filters 1 may have, for example, a square shape.

In the radio-frequency module 100, each of the plurality of substrates 110 is a silicon substrate. The resistivity of the silicon substrate is, for example, greater than or equal to 100 Ωcm, preferably greater than or equal to 1000 Ωcm, and more preferably greater than or equal to 4000 Ωcm.

The low acoustic velocity film 114 is located apart from the outer edge of the substrate 110 in plan view in the thickness direction of the substrate 110. The substrate 110 has a first major surface 111 and a second major surface 112 opposite to each other in the thickness direction. Each of the plurality of transmission filters 1 further includes an electrically insulating layer 117 that covers a region not covered with the low acoustic velocity film 114 on the first major surface 111 of the substrate 110. The electrically insulating layer 117 has electrical insulating properties. The electrically insulating layer 117 is formed along the outer edge of the substrate 110 on the first major surface 111 of the substrate 110. The electrically insulating layer 117 surrounds the plurality of interdigital transducer electrodes 116. In plan view in the thickness direction of the substrate 110, the electrically insulating layer 117 has a frame shape (for example, a rectangular frame shape). Part of the electrically insulating layer 117 overlaps the outer peripheral part of the piezoelectric layer 115 in the thickness direction of the substrate 110. The outer peripheral surface of the piezoelectric layer 115 and the outer peripheral surface of the low acoustic velocity film 114 are covered with the electrically insulating layer 117. The material of the electrically insulating layer 117 is, for example, epoxy resin, polyimide, or the like.

The material of the piezoelectric layer 115 is, for example, lithium niobate or lithium tantalate. The low acoustic velocity film 114 is a film through which a bulk wave propagates at an acoustic velocity lower than a bulk wave propagates through the piezoelectric layer 115. The material of the low acoustic velocity film 114 is, for example, silicon oxide; however, the material is not limited to silicon oxide. In the substrate 110, a bulk wave propagates through the substrate 110 at an acoustic velocity higher than an acoustic wave propagates through the piezoelectric layer 115. Here, a bulk wave that propagates through the substrate 110 is a bulk wave that propagates through the substrate 110 at the lowest acoustic velocity of a plurality of bulk waves that propagate through the substrate 110.

Each of the plurality of transmission filters 1 may further include a high acoustic velocity film provided between the silicon substrate 110 and the low acoustic velocity film 114. The high acoustic velocity film is a film through which a bulk wave propagates at an acoustic velocity higher than an acoustic wave propagates through the piezoelectric layer 115. The material of the high acoustic velocity film is, for example, silicon nitride; however, the material is not limited to silicon nitride.

The thickness of the piezoelectric layer 115 is, for example, less than or equal to 3.5λ where the wave length of an acoustic wave, which is determined by the electrode finger pitch of the interdigital transducer electrode 116, is λ. The thickness of the low acoustic velocity film 114 is, for example, less than or equal to 2.0λ.

Each of the plurality of transmission filters 1 may include, for example, an adhesion layer interposed between the low acoustic velocity film 114 and the piezoelectric layer 115. The adhesion layer is made of, for example, a resin (epoxy resin or polyimide resin). Each of the plurality of transmission filters 1 may include a dielectric film between the low acoustic velocity film 114 and the piezoelectric layer 115, on or above the piezoelectric layer 115, or on or below the low acoustic velocity film 114.

The spacer layer 118 is provided on the first major surface 111 side of the substrate 110. The spacer layer 118 surrounds the plurality of interdigital transducer electrodes 116 in plan view in the thickness direction of the substrate 110. In plan view in the thickness direction of the substrate 110, the spacer layer 118 has a rectangular frame shape. The spacer layer 118 has electrical insulating properties. The material of the spacer layer 118 is epoxy resin, polyimide, or the like. The cover member 119 has a flat shape. The cover member 119 is disposed on the spacer layer 118 so as to be opposite to the substrate 110 in the thickness direction of the substrate 110. The cover member 119 overlaps the plurality of interdigital transducer electrodes 116 in the thickness direction of the substrate 110 and is spaced apart from the plurality of interdigital transducer electrodes 116 in the thickness direction of the substrate 110. The cover member 119 has electrical insulating properties. The material of the cover member 119 is, for example, epoxy resin, polyimide, or the like. Each of the plurality of transmission filters 1 includes a space S1 surrounded by the substrate 110, the spacer layer 118, and the cover member 119. Gas is contained in the space S1. Gas is air, inert gas (for example, nitrogen gas), or the like. The plurality of terminals 120 is exposed from the cover member 119.

The power amplifier 3 is a power amplifier IC chip including a circuit portion having the driver stage amplifier 31 (see FIG. 9), the two final stage amplifiers 32A, 32B (see FIG. 9), and the first balun 33 (see FIG. 9). The power amplifier 3 is flip-chip mounted on the first major surface 131 of the mounting substrate 130. In plan view in the thickness direction D1 of the mounting substrate 130, the outer peripheral shape of the power amplifier 3 is a rectangular shape. Each of the driver stage amplifier 31, the final stage amplifier 32A, and the final stage amplifier 32B includes an amplifier transistor. The amplifier transistor is, for example, a heterojunction bipolar transistor (HBT). In this case, the power amplifier IC chip that makes up the power amplifier 3 is, for example, a GaAs IC chip. The amplifier transistor is not limited to a bipolar transistor, such as a HBT, and may be, for example, a field effect transistor (FET). The FET is, for example, metal-oxide-semiconductor field effect transistor (MOSFET). The power amplifier IC chip that makes up the power amplifier 3 is not limited to a GaAs IC chip and may be, for example, an Si IC chip, an SiGe IC chip, or a GaN IC chip.

The second balun 41 of the output matching circuit 4 is provided on the mounting substrate 130. The second balun 41 has the above-described four inductor elements L1 to L4 (see FIG. 9). The two inductor elements L3, L4 are provided in the mounting substrate 130. The inductor element L1 is provided on the first major surface 131 of the mounting substrate 130 so as to overlap the two inductor elements L3, L4 in plan view in the thickness direction D1 of the mounting substrate 130. The inductor element L2 is provided in the mounting substrate 130 so as to overlap the two inductor elements L3, L4 in plan view in the thickness direction D1 of the mounting substrate 130. In the thickness direction D1 of the mounting substrate 130, the inductor element L2 is located on an opposite side to the inductor element L1 when viewed from the two inductor elements L3, L4.

The five circuit elements 42 of the output matching circuit 4 each are an inductor or a capacitor. In plan view in the thickness direction D1 of the mounting substrate 130, the circuit element 42 disposed between the two transmission filters 1 is an inductor L42.

In FIG. 1, the LC resonant circuit is not shown; however, the capacitor C1 (see FIG. 9) of the LC resonant circuit is mounted on the first major surface 131 of the mounting substrate 130. The two inductors Lc1, Lc2 (see FIG. 9) of the LC resonant circuit are provided on or in the mounting substrate 130.

Each of the six receiving filters 2 is, for example, a ladder filter and has a plurality of (for example, four) series arm resonators and a plurality of (for example, three) parallel arm resonators. Each of the six receiving filters 2 is, for example, an acoustic wave filter. The acoustic wave filter is configured such that each of a plurality of series arm resonators and a plurality of parallel arm resonators is made up of an acoustic wave resonator. The acoustic wave filter is, for example, a surface acoustic wave filter that uses surface acoustic waves. In the surface acoustic wave filter, each of the plurality of series arm resonators and the plurality of parallel arm resonators is, for example, a surface acoustic wave (SAW) resonator. Each of the six receiving filters 2 has a package structure similar to the four transmission filters 1. In plan view in the thickness direction D1 of the mounting substrate 130, the outer peripheral shape of each of the six receiving filters 2 is a rectangular shape.

Figure 2:
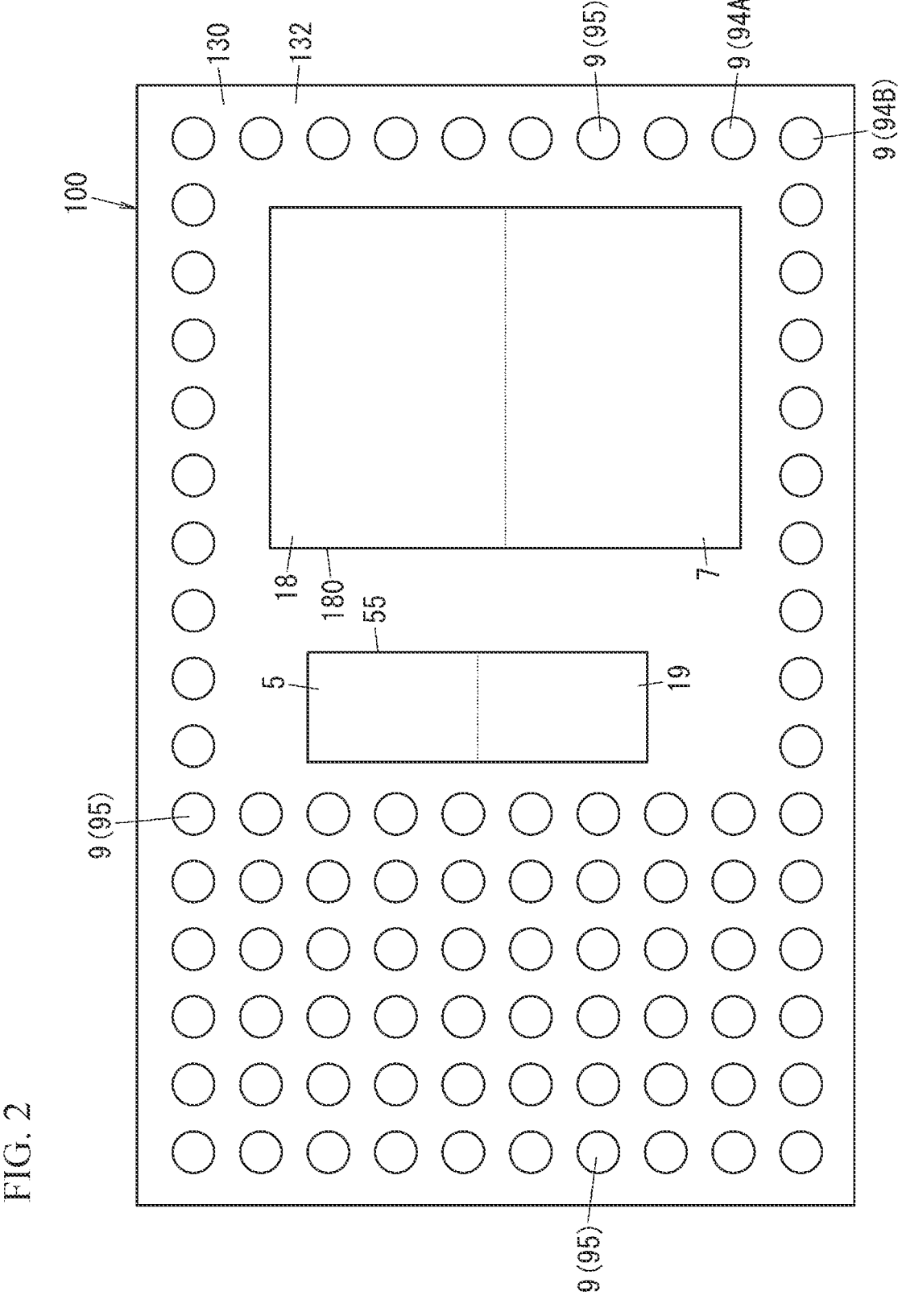
FIG. 2 is a plan view that shows the radio-frequency module and that shows a second major surface of a mounting substrate and a plurality of circuit components and a plurality of external connection terminals disposed on the second major surface of the mounting substrate when seen through from a first major surface side of the mounting substrate.

As shown in FIG. 2, the low-noise amplifier 18 is mounted on the second major surface 132 of the mounting substrate 130. In the radio-frequency module 100 according to the first embodiment, an IC chip 180 (hereinafter, also referred to as first IC chip 180) including the low-noise amplifier 18 and the first switch 7 is mounted on the second major surface 132 of the mounting substrate 130. Here, the first IC chip 180 is flip-chip mounted on the second major surface 132 of the mounting substrate 130. In plan view in the thickness direction D1 of the mounting substrate 130, the outer peripheral shape of the first IC chip 180 is a rectangular shape. The six amplifier transistors of the low-noise amplifier 18 are field effect transistors; however, the configuration is not limited thereto. The six amplifier transistors of the low-noise amplifier 18 may be, for example, bipolar transistors. The first IC chip 180 is an Si IC chip; however, the configuration is not limited thereto.

The circuit component (inductor) of each of the six input matching circuits 17 is, for example, a chip inductor. The circuit component of each of the six input matching circuits 17 is, for example, mounted on the first major surface 131 of the mounting substrate 130. In plan view in the thickness direction D1 of the mounting substrate 130, the outer peripheral shape of the circuit component of each of the six input matching circuits 17 is a rectangular shape. Each of the six input matching circuits 17 may include an internal layer inductor provided in the mounting substrate 130.

As shown in FIG. 2, the second switch 5 is mounted on the second major surface 132 of the mounting substrate 130. In the radio-frequency module 100 according to the first embodiment, a second IC chip 55 including the second switch 5 and the controller 19 is mounted on the second major surface 132 of the mounting substrate 130. Here, the second IC chip 55 is flip-chip mounted on the second major surface 132 of the mounting substrate 130. In plan view in the thickness direction D1 of the mounting substrate 130, the outer peripheral shape of the second IC chip 55 is a rectangular shape. The second IC chip 55 is an Si IC chip; however, the configuration is not limited thereto.

The circuit component (inductor) of each of the four first matching circuits 6 is, for example, a chip inductor. The circuit component of each of the four first matching circuits 6 is, for example, mounted on the first major surface 131 of the mounting substrate 130. In plan view in the thickness direction D1 of the mounting substrate 130, the outer peripheral shape of the circuit component of each of the four first matching circuits 6 is a rectangular shape. Each of the four first matching circuits 6 may include an internal layer inductor provided in the mounting substrate 130.

The circuit component (inductor) of each of the three second matching circuits 8 is, for example, a chip inductor. The circuit component of each of the three second matching circuits 8 is, for example, mounted on the first major surface 131 of the mounting substrate 130. In plan view in the thickness direction D1 of the mounting substrate 130, the outer peripheral shape of the circuit component of each of the three second matching circuits 8 is a rectangular shape. Each of the three second matching circuits 8 may include an internal layer inductor provided in the mounting substrate 130.

The plurality of external connection terminals 9 is disposed on the second major surface 132 of the mounting substrate 130. The phrase "the external connection terminals 9 are disposed on the second major surface 132 of the mounting substrate 130" includes not only the structure that the external connection terminals 9 are mechanically connected to the second major surface 132 of the mounting substrate 130 but also the structure that the external connection terminals 9 are electrically connected to (appropriate conductor portions of) the mounting substrate 130. The material of the plurality of external connection terminals 9 is, for example, metal (for example, copper, copper alloy, or the like). Each of the plurality of external connection terminals 9 is a columnar electrode. The columnar electrode is, for example, a cylindrical electrode. The plurality of external connection terminals 9 is bonded to the conductor portions of the mounting substrate 130 by, for example, solder; however, the configuration is not limited thereto. The plurality of external connection terminals 9 may be bonded by using, for example, electrically conductive adhesive (for example, electrically conductive paste) or may be directly bonded.

The plurality of external connection terminals 9 includes the signal input terminal 91, the signal output terminal 92, the control terminal 93, the three antenna terminals 94A, 94B, 94C, and the plurality of ground terminals 95. The plurality of ground terminals 95 is electrically connected to the ground layer of the mounting substrate 130. The ground layer is a circuit ground of the radio-frequency module 100. The plurality of circuit components of the radio-frequency module 100 includes circuit components electrically connected to the ground layer.

The resin layer 15 (hereinafter, referred to as first resin layer 15) is disposed on the first major surface 131 of the mounting substrate 130 and covers the outer peripheral surface 103 of each of the plurality of transmission filters 1. In the radio-frequency module 100 according to the first embodiment, the first resin layer 15 covers the circuit components of the first group, mounted on the first major surface 131 of the mounting substrate 130, of the plurality of circuit components. The first resin layer 15 includes resin (for example, epoxy resin). The first resin layer 15 may include a filler in addition to resin.

The radio-frequency module 100 further includes a second resin layer 20 disposed on the second major surface 132 of the mounting substrate 130. The second resin layer 20 covers the circuit components of the second group, mounted on the second major surface 132 of the mounting substrate 130, and the outer peripheral surface of each of the plurality of external connection terminals 9. The second resin layer 20 includes resin (for example, epoxy resin). The second resin layer 20 may include a filler in addition to resin. The material of the second resin layer 20 may be the same material as the material of the first resin layer 15 or may be a different material. The second resin layer 20 has a major surface 201 (see FIG. 3) on an opposite side to the mounting substrate 130 side.

The shield layer 16 covers the resin layer 15 and the four transmission filters 1. The major surface 102 of each of the plurality of transmission filters 1 on an opposite side to the mounting substrate 130 side is in contact with the shield layer 16. The shield layer 16 has an electrical conductivity. The shield layer 16 has a multilayer structure in which a plurality of metal layers is laminated; however, the configuration is not limited thereto. The shield layer 16 may be a single metal layer. The metal layer includes one or more types of metals. The shield layer 16 covers a major surface 151 of the first resin layer 15 on an opposite side to the mounting substrate 130 side, an outer peripheral surface 153 of the first resin layer 15, and an outer peripheral surface 133 of the mounting substrate 130. The shield layer 16 also covers an outer peripheral surface 203 of the second resin layer 20. The shield layer 16 is in contact with at least part of the outer peripheral surface of the ground layer of the mounting substrate 130. Thus, the potential of the shield layer 16 can be set to the same potential as the potential of the ground layer.

(1.3) Layout of Circuit Components in Radio-Frequency Module

In the radio-frequency module 100, in plan view in the thickness direction D1 of the mounting substrate 130, in a direction parallel to the direction in which the output matching circuit 4 and the power amplifier 3 are arranged, the first transmission filter 11, the second transmission filter 12, the third transmission filter 13, and the fourth transmission filter 14 are arranged in order of the first transmission filter 11, the second transmission filter 12, the third transmission filter 13, and the fourth transmission filter 14.

In the radio-frequency module 100, in plan view in the thickness direction D1 of the mounting substrate 130, the four transmission filters 1 are located between the output matching circuit 4 and the six input matching circuits 17.

In the radio-frequency module 100, in plan view in the thickness direction D1 of the mounting substrate 130, the four transmission filters 1 are located between the output matching circuit 4 and the six first matching circuits 6.

In the radio-frequency module 100, in plan view in the thickness direction D1 of the mounting substrate 130, the plurality of transmission filters 1 is located between the output matching circuit 4 and the three second matching circuits 8.

In the radio-frequency module 100, the output matching circuit 4 includes the inductor L42 adjacent to at least one transmission filter 1 of the plurality of transmission filters 1 in plan view in the thickness direction D1 of the mounting substrate 130. The inductor L42 is adjacent to the two transmission filters 1 in plan view in the thickness direction D1 of the mounting substrate 130. The phrase "the inductor L42 is adjacent to the transmission filter 1" means that there is no other circuit component between the inductor L42 and the transmission filter 1 in plan view in the thickness direction D1 of the mounting substrate 130 and the inductor L42 and the transmission filter 1 are adjacent to each other. A winding axis 420 (see FIG. 7) of the inductor L42 is set along the thickness direction D1 of the mounting substrate 130. The winding axis 420 and the thickness direction D1 are parallel to each other; however, the winding axis 420 and the thickness direction D1 are not limited to being strictly parallel to each other and may be substantially parallel to each other. The phrase "substantially parallel" means that an angle formed between the winding axis 420 and the thickness direction D1 is smaller than or equal to 10 degrees. The inductor L42 is a chip inductor that has a pair of electrodes 421, 421 and a winding part 423 connected between the pair of electrodes 421, 421. The winding axis 420 is the winding axis of the winding part 423.

In the radio-frequency module 100, the first IC chip 180 does not overlap the plurality of transmission filters 1 in plan view in the thickness direction D1 of the mounting substrate 130.

In the radio-frequency module 100, at least one (two in the illustrated example) of the plurality of transmission filters 1) overlaps the second IC chip 55 in plan view in the thickness direction D1 of the mounting substrate 130. In plan view in the thickness direction D1 of the mounting substrate 130, part of each of the second transmission filter 12 and the third transmission filter 13 overlaps part of the second IC chip 55; however, the configuration is not limited thereto. The entire part of each of the second transmission filter 12 and the third transmission filter 13 may overlap part of the second IC chip 55.

In the radio-frequency module 100, the power amplifier 3 does not overlap the low-noise amplifier 18 in plan view in the thickness direction D1 of the mounting substrate 130.

The circuit configuration of the radio-frequency module 100 has a transmitting circuit for transmitting a transmission signal and a receiving circuit for receiving a reception signal. In the radio-frequency module 100, of the plurality of circuit components, circuit components included only in the transmitting circuit do not overlap the other circuit components (circuit components included only in the receiving circuit and circuit components shared between the transmitting circuit and the receiving circuit) in the thickness direction D1 of the mounting substrate 130. Of the plurality of circuit components, a group of the circuit components included only in the transmitting circuit includes the four transmission filters 1, the power amplifier 3, the output matching circuit 4, and the second IC chip 55. Of the plurality of circuit components, a group of the circuit components included only in the receiving circuit includes the six receiving filters 2, and the six input matching circuits 17. A group of the circuit components shared between the transmitting circuit and the receiving circuit includes the first switch 7, the four first matching circuits 6, the three second matching circuits 8, and the first IC chip 180.

In plan view in the thickness direction D1 of the mounting substrate 130, the radio-frequency module 100 is divided into a first region and a second region. In the first region, a group of circuit components included only in the transmitting circuit of the plurality of circuit components is disposed. In the second region, a group of circuit components included only in the receiving circuit and a group of circuit components shared between the transmitting circuit and the receiving circuit are disposed.

(1.4) Manufacturing Method for Radio-Frequency Module

The manufacturing method for the radio-frequency module 100 may adopt, for example, a manufacturing method including a first process, a second process, a third process, a fourth process, and a fifth process. The first process is a process in which the plurality of circuit components is mounted on the mounting substrate 130 and the plurality of external connection terminals 9 is disposed. The plurality of circuit components includes the plurality of transmission filters 1 and the like. The second process is a process in which a first resin material layer that covers the plurality of transmission filters 1 and the like and that is a source of the first resin layer 15 is formed on the first major surface 131 side of the mounting substrate 130 and a second resin material layer that is a source of the second resin layer 20 is formed on the second major surface 132 side of the mounting substrate 130. The third process is a process in which the first resin layer 15 is formed and the thickness of each of the substrates 110 is reduced by grinding the first resin material layer from the major surface of the first resin material layer on an opposite side to the mounting substrate 130 side to expose the substrates 110 of the plurality of transmission filters 1, and then grinding the first resin material layer and the substrates 110. The fourth process is a process in which the second resin layer 20 is formed by grinding the second resin material layer from the major surface of the second resin material layer on an opposite side to the mounting substrate 130 side to expose the distal ends of the plurality of external connection terminals 9 and then grinding the second resin material layer and the external connection terminals 9. The fifth process is a process in which the shield layer 16 that is in contact with the major surface 151 of the first resin layer 15 and the major surface 102 of each of the plurality of transmission filters 1 on an opposite side to the mounting substrate 130 side is formed by, for example, sputtering, vapor deposition, or printing.

Figure 6:
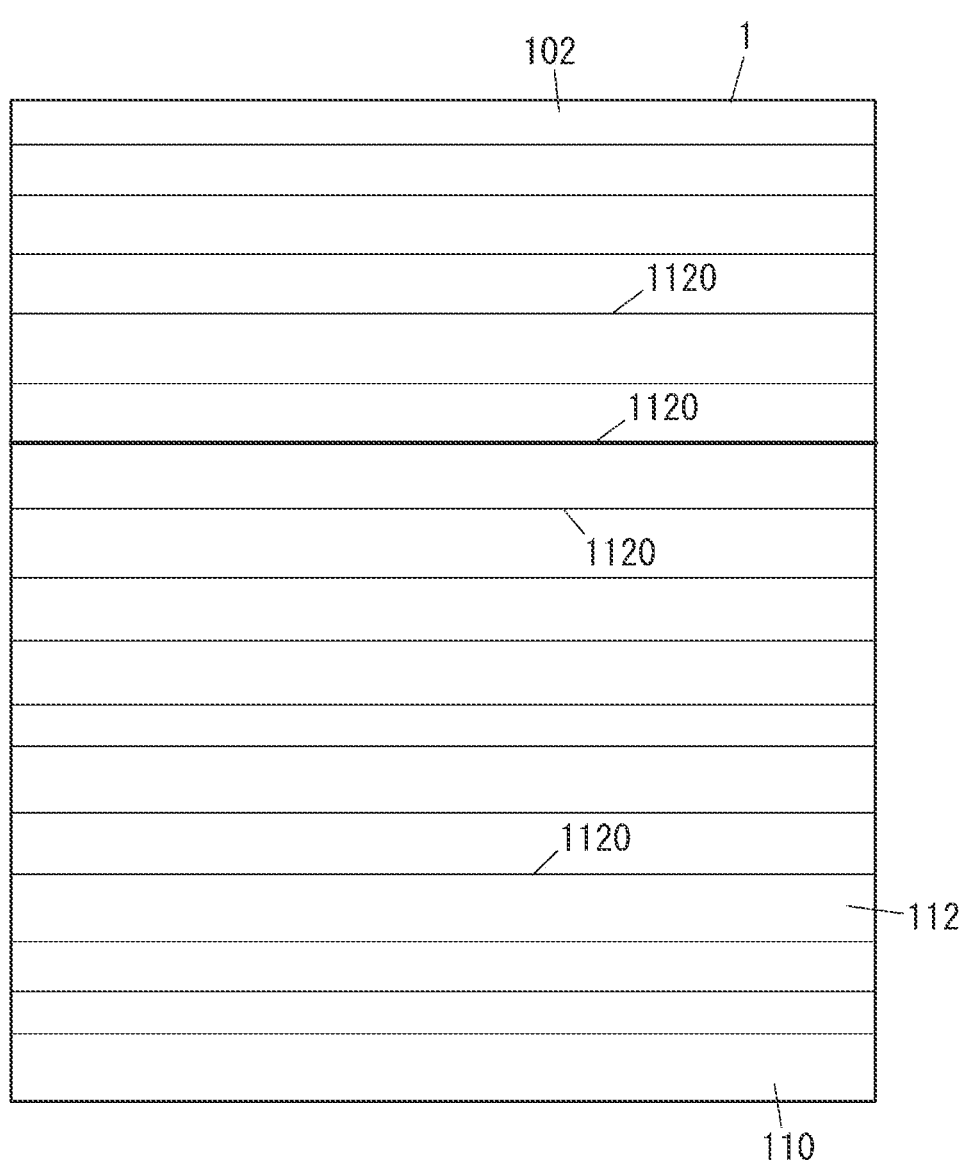
FIG. 6 is a plan view that relates to the radio-frequency module and that shows a major surface of each transmission filter on an opposite side to the mounting substrate side.
Figure 7:
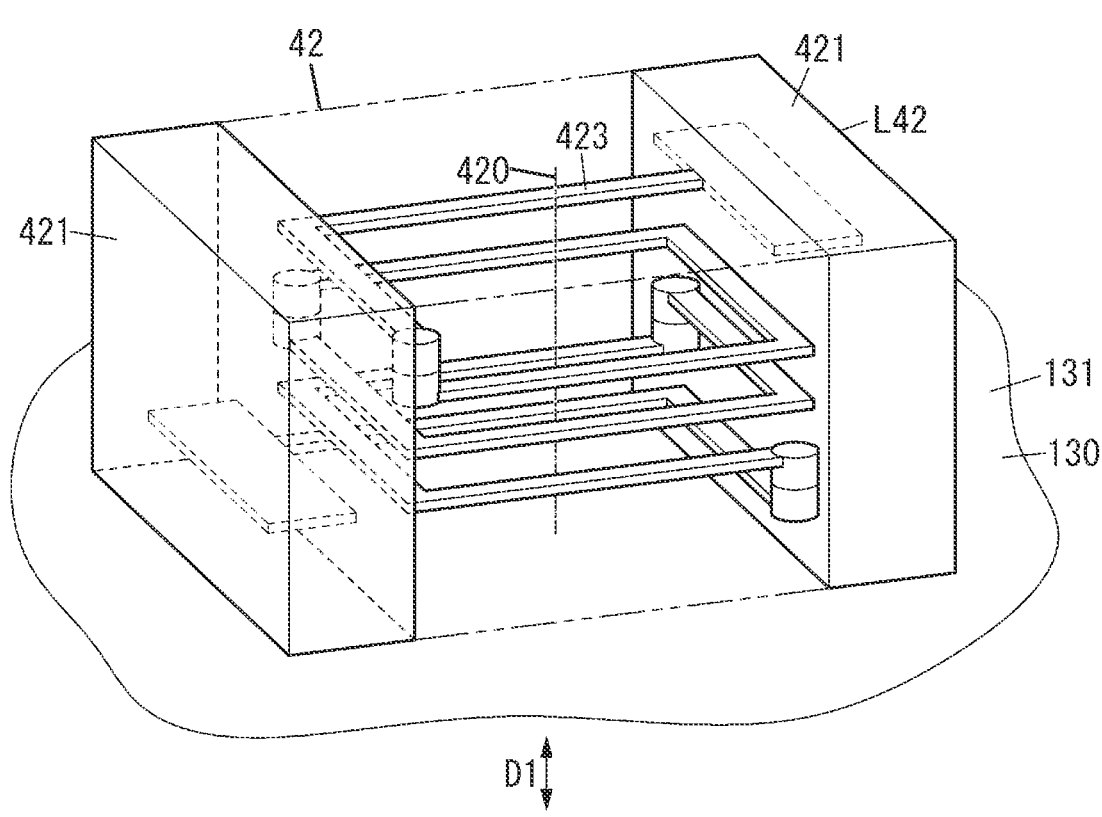
FIG. 7 is a view that illustrates circuit components included in an output matching circuit of the radio-frequency module.

With the radio-frequency module 100 manufactured by a manufacturing method including the above third process, the major surface 102 of each of the plurality of transmission filters 1 can have, for example, a grinding mark 1120 as shown in FIG. 6.

(2) Advantageous Effects (2.1) Radio-Frequency Module

The radio-frequency module 100 according to the first embodiment includes a mounting substrate 130, a plurality of transmission filters 1, a resin layer 15, and a shield layer 16. The mounting substrate 130 has a first major surface 131 and a second major surface 132 opposite to each other. The plurality of transmission filters 1 is mounted on the first major surface 131 of the mounting substrate 130. The resin layer 15 is disposed on the first major surface 131 of the mounting substrate 130 and covers an outer peripheral surface 103 of each of the plurality of transmission filters 1. The shield layer 16 covers the resin layer 15 and the plurality of transmission filters 1. A major surface 102 of each of the plurality of transmission filters 1 on an opposite side to the mounting substrate 130 side is in contact with the shield layer 16.

The radio-frequency module 100 according to the first embodiment is capable of improving the heat dissipation capability. The radio-frequency module 100 according to the first embodiment is capable of dissipating the heat generated in each of the plurality of transmission filters 1 through the shield layer 16. Thus, the radio-frequency module 100 according to the first embodiment is capable of stabilizing the temperature characteristics of an acoustic wave filter that makes up each of the plurality of transmission filters 1 and is capable of stabilizing the characteristics of the radio-frequency module 100.

In the radio-frequency module 100 according to the first embodiment, from the viewpoint of improving the heat dissipation capability, the shield layer 16 is preferably in contact with the entire area of the major surface 102 of each of the plurality of transmission filters 1 on an opposite side to the mounting substrate 130 side. However, the condition that the shield layer 16 is in contact with the entire surface of the major surface 102 of each of the transmission filters 1 is not indispensable.

In the radio-frequency module 100 according to the first embodiment, each of the substrates 110 of the plurality of transmission filters 1 is a silicon substrate, so there is an advantage in easy grinding when the substrates 110 of the plurality of transmission filters 1 are ground from an opposite side to the mounting substrate 130 side, for example, during manufacturing.

(2.2) Communication Device

The communication device 300 according to the first embodiment includes a signal processing circuit 301 and the radio-frequency module 100. The signal processing circuit 301 is connected to the radio-frequency module 100.

The communication device 300 according to the first embodiment includes the radio-frequency module 100, so it is possible to improve the heat dissipation capability.

A plurality of electronic components that make up the signal processing circuit 301 may be mounted on, for example, the above-described circuit board or may be mounted on a circuit board (second circuit board) different from the circuit board (first circuit board) on which the radio-frequency module 100 is mounted.

(3) Modifications of Radio-Frequency Module (3.1) First Modification

Figure 10:
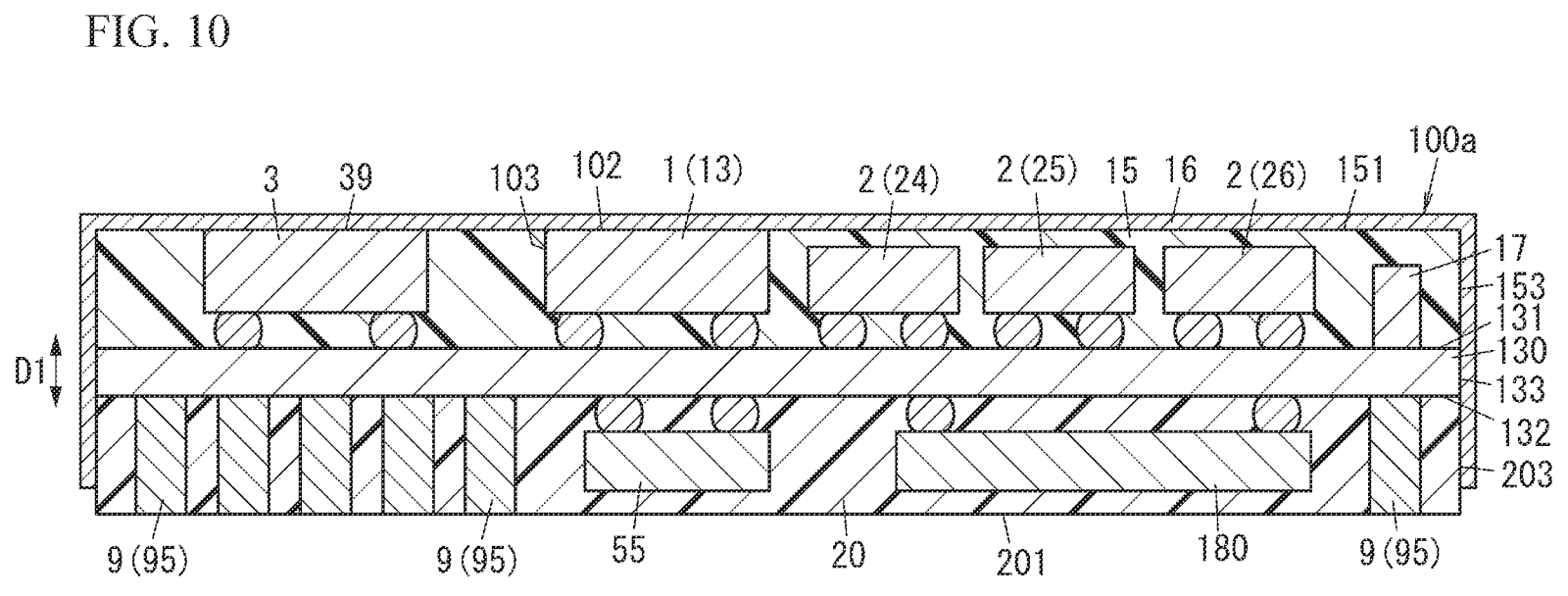

A radio-frequency module 100a according to a first modification of the first embodiment will be described with reference to FIG. 10. For the radio-frequency module 100a according to the first modification, like reference signs denote component elements similar to those of the radio-frequency module 100 according to the first embodiment, and the description is omitted.

The radio-frequency module 100a according to the first modification differs from the radio-frequency module 100 according to the first embodiment in that a major surface 39 of the power amplifier 3 on an opposite side to the mounting substrate 130 side is in contact with the shield layer 16.

In the radio-frequency module 100a according to the first modification, as in the case of the radio-frequency module 100 according to the first embodiment, the major surface 102 of each of the plurality of transmission filters 1 on an opposite side to the mounting substrate 130 side is in contact with the shield layer 16, so it is possible to improve the heat dissipation capability.

In the radio-frequency module 100a according to the first modification, the major surface 39 of the power amplifier 3 on an opposite side to the mounting substrate 130 side is in contact with the shield layer 16, so the heat generated in the power amplifier 3 is easily dissipated through the shield layer 16.

(3.2) Second Modification

Figure 11:
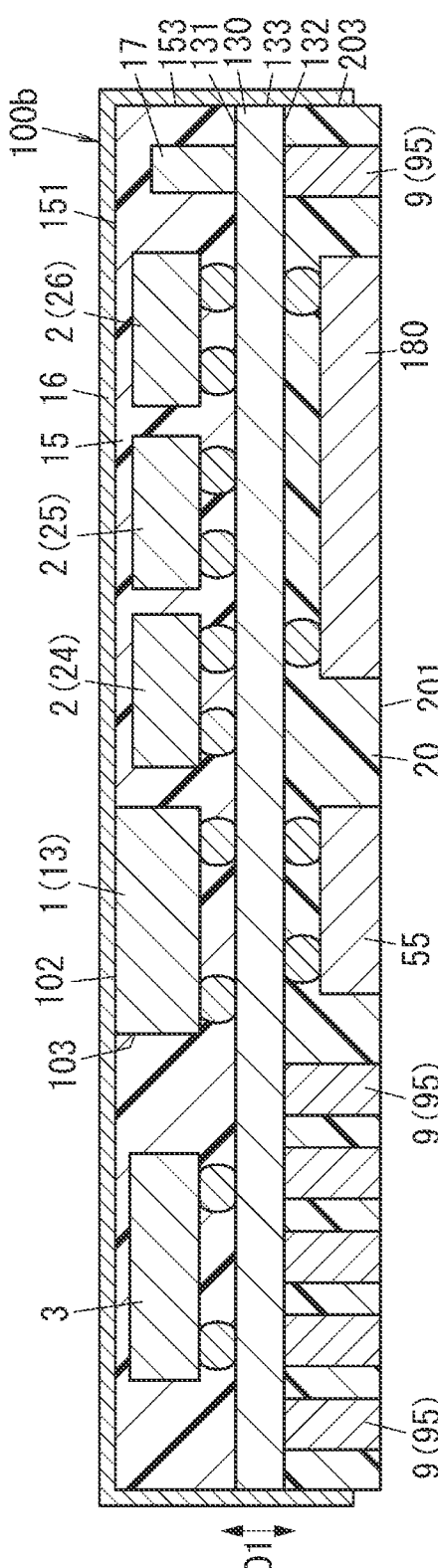
FIG. 11 is a cross-sectional view of a radio-frequency module according to a second modification of the first embodiment.

A radio-frequency module 100b according to a second modification of the first embodiment will be described with reference to FIG. 11. For the radio-frequency module 100b according to the second modification, like reference signs denote component elements similar to those of the radio-frequency module 100 according to the first embodiment, and the description is omitted.

The radio-frequency module 100b according to the second modification differs from the radio-frequency module 100 according to the first embodiment in that a major surface of each of the first IC chip 180 and the second IC chip 55 on an opposite side to the mounting substrate 130 side is exposed. In the radio-frequency module 100b, the major surface of each of the first IC chip 180 and the second IC chip 55 on an opposite side to the mounting substrate 130 side and a major surface 201 of the second resin layer 20 on an opposite side to the mounting substrate 130 side are substantially flush with each other.

The radio-frequency module 100b according to the second modification allows a reduction in profile as compared to the radio-frequency module 100 according to the first embodiment.

(3.3) Third Modification

Figure 12:
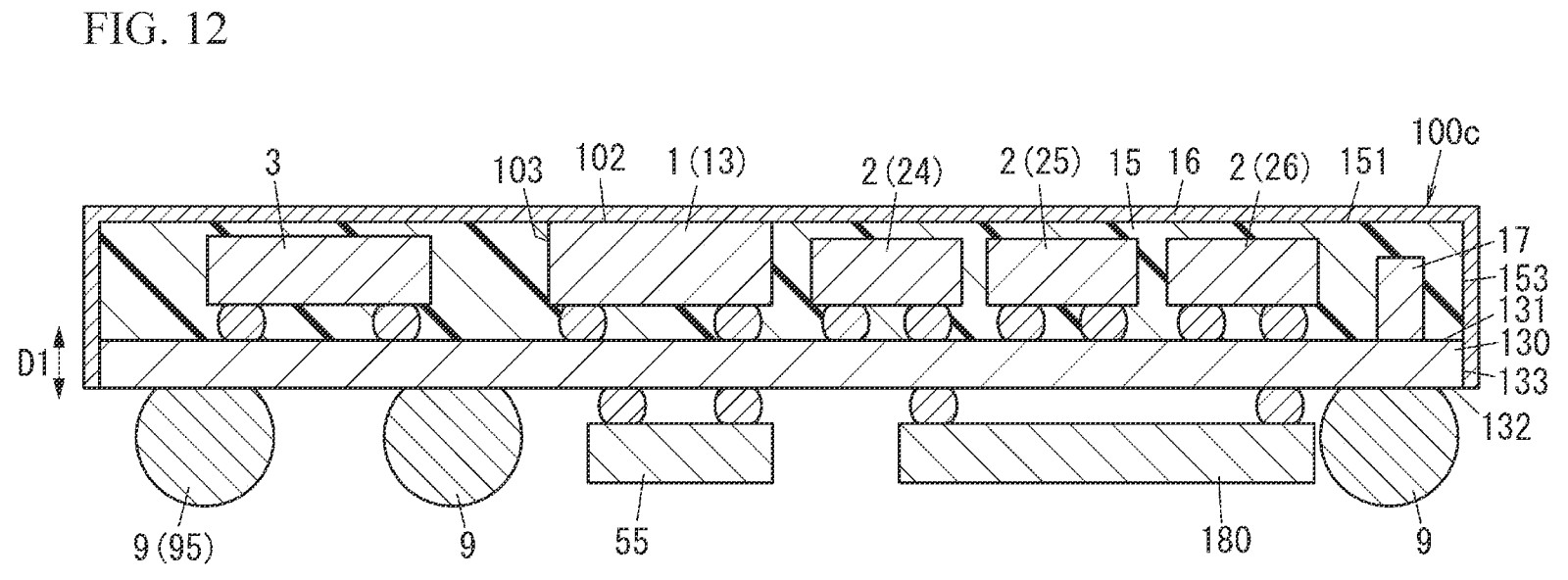

A radio-frequency module 100c according to a third modification of the first embodiment will be described with reference to FIG. 12. For the radio-frequency module 100c according to the third modification, like reference signs denote component elements similar to those of the radio-frequency module 100 according to the first embodiment, and the description is omitted.

The radio-frequency module 100c according to the third modification differs from the radio-frequency module 100 according to the first embodiment in that the plurality of external connection terminals 9 is ball bumps. The radio-frequency module 100c according to the third modification differs from the radio-frequency module 100 according to the first embodiment in that the radio-frequency module 100*c* according to the third modification does not include the second resin layer 20 of the radio-frequency module 100 according to the first embodiment. The radio-frequency module 100*c* according to the third modification may include an underfill portion provided between the second major surface 132 of the mounting substrate 130 and the first IC chip 180 mounted on the second major surface 132 of the mounting substrate 130 and an underfill portion provided between the second major surface 132 of the mounting substrate 130 and the second IC chip 55 mounted on the second major surface 132 of the mounting substrate 130.

The material of the ball bump that makes up each of the plurality of external connection terminals 9 is, for example, gold, copper, solder, or the like.

The plurality of external connection terminals 9 may mixedly include the external connection terminals 9 each made up of a ball bump and the external connection terminals 9 each made up of a columnar electrode.

(3.4) Fourth Modification

Figure 13:
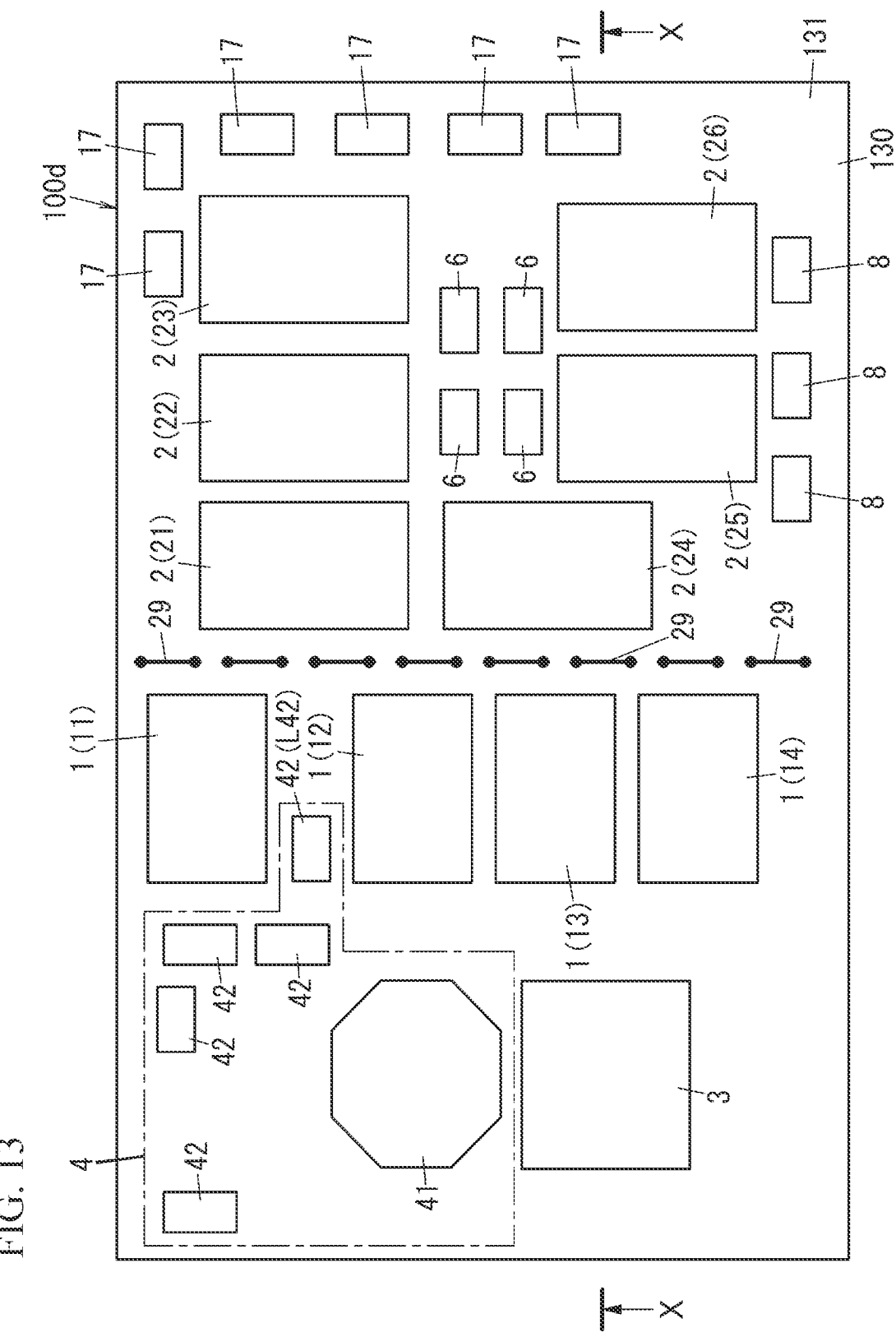
FIG. 13 is a plan view of a radio-frequency module according to a fourth modification of the first embodiment.
Figure 14:
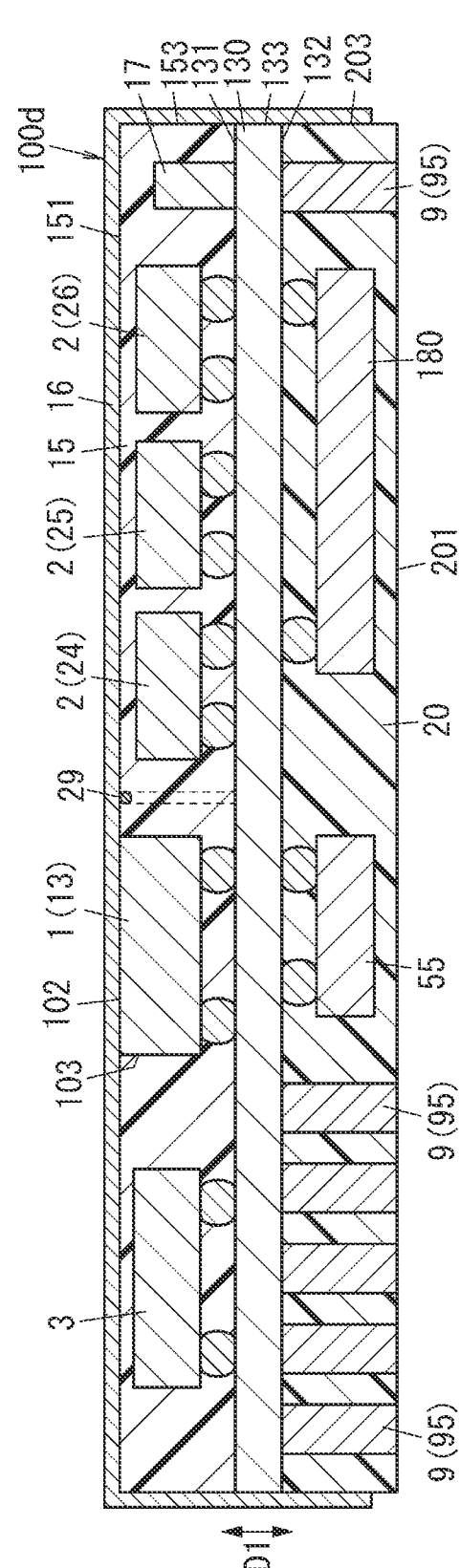
FIG. 14 is a cross-sectional view of the radio-frequency module, taken along the line X-X in FIG. 13.

A radio-frequency module 100*d* according to a fourth modification of the first embodiment will be described with reference to FIGS. 13 and 14. For the radio-frequency module 100*d* according to the fourth modification, like reference signs denote component elements similar to those of the radio-frequency module 100 according to the first embodiment, and the description is omitted.

The radio-frequency module 100*d* according to the fourth modification differs from the radio-frequency module 100 according to the first embodiment in that the radio-frequency module 100*d* according to the fourth modification further includes shield members 29.

The receiving circuit includes the plurality of receiving filters 2 mounted on the first major surface 131 of the mounting substrate 130. The shield members 29 are disposed on the first major surface 131 of the mounting substrate 130 and are disposed between the receiving circuit and the plurality of transmission filters 1 in plan view in the thickness direction D1 of the mounting substrate 130. The shield layer 16 covers the shield members 29. The shield members 29 are in contact with the shield layer 16. Each of the shield members 29 is an electrically conductive wire formed in an arch shape and having both ends connected to the mounting substrate 130. The radio-frequency module 100*d* includes the plurality of shield members 29. The plurality of shield members 29 is arranged in a direction in which the plurality of transmission filters 1 is arranged.

In the radio-frequency module 100*d* according to the fourth modification, the characteristics of the receiving circuit are insusceptible to the plurality of transmission filters 1.

Each of the shield members 29 is not limited to an electrically conductive wire and may be a metal block or the like that is long in the direction in which the plurality of transmission filters 1 is arranged or may be a metal column.

Second Embodiment

A radio-frequency module 100*e* according to a second embodiment will be described with reference to FIG. 15. For the radio-frequency module 100*e* according to the second embodiment, like reference signs denote component elements similar to those of the radio-frequency module 100 according to the first embodiment, and the description is omitted. The circuit configuration of the radio-frequency module 100*e* is similar to the circuit configuration of the radio-frequency module 100 according to the first embodiment described with reference to FIGS. 8 and 9.

The radio-frequency module 100*e* according to the second embodiment differs from the radio-frequency module 100 according to the first embodiment in that the radio-frequency module 100*e* according to the second embodiment includes a plurality of metal members 140. The plurality of metal members 140 is disposed on the major surface 102 of each of the plurality of transmission filters 1 on an opposite side to the mounting substrate 130 side.

The resin layer 15 is disposed on the first major surface 131 of the mounting substrate 130 and covers the outer peripheral surfaces 103 of the plurality of transmission filters 1 and outer peripheral surfaces 143 of the plurality of metal members 140. The shield layer 16 covers the resin layer 15 and the plurality of metal members 140. The plurality of metal members 140 is in contact with the shield layer 16.

In plan view in the thickness direction D1 of the mounting substrate 130, each of the plurality of metal members 140 has a rectangular shape; however, the configuration is not limited thereto. In plan view in the thickness direction D1 of the mounting substrate 130, each of the plurality of metal members 140 has the same size as a corresponding one of the transmission filters 1, with which the metal member 140 contacts; however, the configuration is not limited thereto. Each of the plurality of metal members 140 may be larger or may be smaller than a corresponding one of the transmission filters 1, with which the metal member 140 contacts. The material of the plurality of metal members 140 is, for example, copper or copper alloy. The plurality of metal members 140 may be respectively bonded to the major surfaces 102 of the transmission filters 1 or may be respectively in contact with the major surfaces 102. The materials of the plurality of metal members 140 are preferably the same.

The radio-frequency module 100*e* according to the second embodiment includes the mounting substrate 130, the plurality of transmission filters 1, the plurality of metal members 140, the resin layer 15, and the shield layer 16. The mounting substrate 130 has a first major surface 131 and a second major surface 132 opposite to each other. The plurality of transmission filters 1 is mounted on the first major surface 131 of the mounting substrate 130. The plurality of metal members 140 is disposed on the major surface 102 of each of the plurality of transmission filters 1 on an opposite side to the mounting substrate 130 side. The resin layer 15 is disposed on the first major surface 131 of the mounting substrate 130 and covers the outer peripheral surfaces 103 of the plurality of transmission filters 1 and the outer peripheral surfaces 143 of the plurality of metal members 140. The shield layer 16 covers the resin layer 15 and the plurality of metal members 140. The plurality of metal members 140 is in contact with the shield layer 16 and the major surfaces 102 of corresponding transmission filters 1 of the plurality of transmission filters 1 on an opposite side to the mounting substrate 130 side. Each of the plurality of metal members 140 has a major surface 141 and a major surface 142. The major surface 141 is in contact with the major surface 102 of a corresponding transmission filter 1 of the plurality of transmission filters 1 on an opposite side to the mounting substrate 130 side. The major surface 142 is in contact with the shield layer 16.

The radio-frequency module 100*e* according to the second embodiment is capable of improving the heat dissipation capability. Thus, the radio-frequency module 100*e* according to the second embodiment is capable of suppressing an increase in the temperature of the plurality of transmission filters 1 and is capable of stabilizing the characteristics.

(Other Modifications)

Each of the above-described first and second embodiments and the like is just one of various embodiments of the present disclosure. The above-described first and second embodiments, and the like, each may be modified into various forms according to design, or the like, as long as the possible benefit of the present disclosure is achieved.

For example, in the radio-frequency modules 100, 100a, 100b, 100c, 100d, the resin layer 15 is not limited to the one that covers the entire part of the outer peripheral surface 103 of each of the plurality of transmission filters 1 and may cover at least part of the outer peripheral surface 103 of each of the plurality of transmission filters 1.

In the radio-frequency modules 100, 100a, 100b, 100c, 100d, the shield layer 16 just needs to cover the resin layer 15 and at least part of each of the plurality of transmission filters 1. In other words, the shield layer 16 is not limited to the one that covers the resin layer 15 and the entire part of the major surface 102 of each of the plurality of transmission filters 1 on an opposite side to the mounting substrate 130 side and may cover at least part of the major surface 102.

In the radio-frequency modules 100, 100a, 100b, 100c, 100d, the major surface 102 of each of at least two transmission filters 1 of the plurality of transmission filters 1 on an opposite side to the mounting substrate 130 side is not limited to the one of which the entire part is in contact with the shield layer 16. Alternatively, at least part of the major surface 102 just needs to be in contact with the shield layer 16.

In the radio-frequency module 100e, the resin layer 15 is not limited to the one that covers the entire part of the outer peripheral surface 103 of each of the plurality of transmission filters 1 and the entire part of the outer peripheral surface 143 of each of the plurality of metal members 140 and just needs to cover, for example, at least part of the outer peripheral surface 103 of each of the plurality of transmission filters 1 and at least part of the outer peripheral surface 143 of each of the plurality of metal members 140.

The shield layer 16 is not limited to the one that covers the resin layer 15 and the entire part of each of the metal members 140 and just needs to cover the resin layer 15 and at least part of each of the plurality of metal members 140.

The number of the transmission filters 1 just needs to be multiple and is not limited to six. The major surface 102 of each of at least two transmission filters 1 on an opposite side to the mounting substrate 130 side just needs to be in contact with the shield layer 16, and a transmission filter 1 of which the major surface 102 is covered with the first resin layer 15 may be included. The substrate 110 of the transmission filter 1 of which the major surface 102 is covered with the first resin layer 15 is not limited to a silicon substrate and may be, for example, a lithium niobate substrate or a lithium tantalate substrate.

In the radio-frequency module 100 according to the first embodiment, the major surface 102 of each of the plurality of transmission filters 1 on an opposite side to the mounting substrate 130 side and the major surface 151 of the resin layer 15 are substantially flush with each other; however, the configuration is not limited thereto.

Each of the plurality of transmission filters 1 and the plurality of receiving filters 2 is not limited to a surface acoustic wave filter and may be, for example, a bulk acoustic wave (BAW) filter. A resonator in the BAW filter is, for example, a film bulk acoustic resonator (FBAR) or a solidly mounted resonator (SMR). The BAW filter has a substrate. The substrate is, for example, a silicon substrate.

Each of the plurality of transmission filters 1 and the plurality of receiving filters 2 is not limited to a ladder filter and may be, for example, a longitudinally coupled resonator-type surface acoustic wave filter.

The above-described acoustic wave filter is an acoustic wave filter that uses surface acoustic waves or bulk acoustic waves; however, the configuration is not limited thereto. The above-described acoustic wave filter may be, for example, an acoustic wave filter that uses boundary acoustic waves, plate waves, or the like.

Each of the plurality of transmission filters 1 includes the substrate 110, and each of the plurality of substrates 110 is a silicon substrate; however, the configuration is not limited thereto. Each of the plurality of substrates 110 may be a lithium tantalate substrate or each of the plurality of substrates 110 may be a lithium niobate substrate. When each of the plurality of substrates 110 is a lithium tantalate substrate or each of the plurality of substrates 110 is a lithium niobate substrate, for example, the plurality of interdigital transducer electrodes 116 just needs to be formed on each substrate 110 without providing the low acoustic velocity film 114 or the piezoelectric layer 115.

The power amplifier 3 is not limited to a differential amplifier circuit. The power amplifier 3 may have a configuration including a driver stage amplifier, an output stage amplifier, and an inter-stage matching circuit that matches the impedance between the driver stage amplifier and the output stage amplifier. In this case, the inter-stage matching circuit is, for example, an inductor provided between the driver stage amplifier and the output stage amplifier and may further include a capacitor in addition to the inductor. The number of the stages of the amplifier in the power amplifier 3 is not limited to two and may be one or may be three or more.

The number of the input matching circuits 17 is not limited to multiple and may be one.

The plurality of circuit components may include a circuit component electrically connected to the mounting substrate 130 with an electrically conductive bump interposed therebetween and a circuit component electrically connected to the mounting substrate 130 with solder interposed therebetween. Alternatively, for example, the plurality of circuit components may include a circuit component electrically connected to the mounting substrate 130 with a bonding wire interposed therebetween.

The radio-frequency module 100 may further include a heat dissipation conductor portion disposed on the second major surface 132 of the mounting substrate 130 and overlapping the power amplifier 3 in the thickness direction D1 of the mounting substrate 130. One ends of the plurality of external connection terminals 9 may make up the heat dissipation conductor portion.

The shield members 29 do not necessarily need to be in contact with the shield layer 16 as long as the shield members 29 are electrically connected to the ground layer of the mounting substrate 130.

The circuit configuration of each of the radio-frequency modules 100 to 100e is not limited to the above-described example. Each of the radio-frequency modules 100 to 100e may have, for example, a radio-frequency front-end circuit that supports multi input multi output (MIMO) as a circuit configuration.

The communication device 300 according to the first embodiment may include any one of the radio-frequency modules 100a, 100b, 100c, 100d, 100e instead of the radio-frequency module 100.

(Aspects)

The following aspects are disclosed in the specification.

A radio-frequency module (100; 100*a*; 100*b*; 100*c*; 100*d*) according to a first aspect includes a mounting substrate (130), a plurality of transmission filters (1), a resin layer (15), and a shield layer (16). The mounting substrate (130) has a first major surface (131) and a second major surface (132) opposite to each other. The plurality of transmission filters (1) is mounted on the first major surface (131) of the mounting substrate (130). The resin layer (15) is disposed on the first major surface (131) of the mounting substrate (130) and covers at least part of an outer peripheral surface (103) of each of the plurality of transmission filters (1). The shield layer (16) covers the resin layer (15) and at least part of each of the plurality of transmission filters (1). At least part of a major surface (102) of each of at least two transmission filters (1) of the plurality of transmission filters (1) on an opposite side to the mounting substrate (130) side is in contact with the shield layer (16).

The radio-frequency module (100; 100*a*; 100*b*; 100*c*; 100*d*) according to the first aspect is capable of improving the heat dissipation capability. Thus, the radio-frequency module (100; 100*a*; 100*b*; 100*c*; 100*d*) according to the first aspect is capable of suppressing an increase in the temperature of the plurality of transmission filters (1) and is capable of stabilizing the characteristics.

A radio-frequency module (100*e*) according to a second aspect includes a mounting substrate (130), a plurality of transmission filters (1), a plurality of metal members (140), a resin layer (15), and a shield layer (16). The mounting substrate (130) has a first major surface (131) and a second major surface (132) opposite to each other. The plurality of transmission filters (1) is mounted on the first major surface (131) of the mounting substrate (130). The plurality of metal members (140) is disposed on a major surface (102) of each of the plurality of transmission filters (1) on an opposite side to the mounting substrate (130) side. The resin layer (15) is disposed on the first major surface (131) of the mounting substrate (130) and covers at least part of an outer peripheral surface (103) of each of the plurality of transmission filters (1) and at least part of an outer peripheral surface (143) of each of the plurality of metal members (140). The shield layer (16) covers the resin layer (15) and at least part of each of the plurality of metal members (140). The plurality of metal members (140) is in contact with the shield layer (16) and the major surfaces (102) of corresponding transmission filters (1) of the plurality of transmission filters (1) on an opposite side to the mounting substrate (130) side.

The radio-frequency module (100*e*) according to the second aspect is capable of improving the heat dissipation capability. Thus, the radio-frequency module (100*e*) according to the second aspect is capable of suppressing an increase in the temperature of the plurality of transmission filters (1) and is capable of stabilizing the characteristics.

In a radio-frequency module (100; 100*a*; 100*b*; 100*c*; 100*d*; 100*e*) according to a third aspect, in the first or second aspect, the major surface (102) of each of the plurality of transmission filters (1) has a grinding mark (1120).

The radio-frequency module (100; 100*a*; 100*b*; 100*c*; 100*d*; 100*e*) according to the third aspect is capable of increasing the surface area of the major surface (102) of each of the plurality of transmission filters (1) and is capable of improving the heat dissipation capability.

In a radio-frequency module (100; 100*a*; 100*b*; 100*c*; 100*d*; 100*e*) according to a fourth aspect, in the third aspect, each of the plurality of transmission filters (1) includes a substrate (110). Each of the plurality of substrates (110) is a silicon substrate, or each of the plurality of substrates (110) is a lithium tantalate substrate, or each of the plurality of substrates (110) is a lithium niobate substrate.

With the radio-frequency module (100; 100*a*; 100*b*; 100*c*; 100*d*; 100*e*) according to the fourth aspect, each of the substrates (110) of the plurality of transmission filters (1) flip-chip mounted on the first major surface (131) of the mounting substrate (130) is easily ground during manufacturing, and the thickness of each of the substrates (110) is easily reduced, so it is possible to improve the heat dissipation capability.

A radio-frequency module (100; 100*a*; 100*b*; 100*c*; 100*d*; 100*e*) according to a fifth aspect, in any one of the first to fourth aspects, further includes a power amplifier (3), an output matching circuit (4), a low-noise amplifier (18), and an input matching circuit (17). The power amplifier (3) is mounted on the mounting substrate (130). The output matching circuit (4) is connected to an output terminal of the power amplifier (3). The low-noise amplifier (18) is mounted on the mounting substrate (130). The input matching circuit (17) is connected to an input terminal of the low-noise amplifier (18). In plan view in a thickness direction (D1) of the mounting substrate (130), the plurality of transmission filters (1) is located between the output matching circuit (4) and the input matching circuit (17).

The radio-frequency module (100; 100*a*; 100*b*; 100*c*; 100*d*; 100*e*) according to the fifth aspect is capable of suppressing the electromagnetic coupling between the output matching circuit (4) and the input matching circuit (17).

A radio-frequency module (100; 100*a*; 100*b*; 100*c*; 100*d*; 100*e*) according to a sixth aspect, in any one of the first to fourth aspects, further includes a power amplifier (3), an output matching circuit (4), a low-noise amplifier (18), an antenna terminal (94A, 94B), a switch (7), and a plurality of matching circuits (6). The power amplifier (3) is mounted on the mounting substrate (130). The output matching circuit (4) is connected to an output terminal of the power amplifier (3). The low-noise amplifier (18) is mounted on the mounting substrate (130). The antenna terminal (94A, 94B) is disposed on the mounting substrate (130). The switch (7) is mounted on the mounting substrate (130). The switch (7) has a common terminal (70A, 70B) connected to the antenna terminal (94A, 94B) and a plurality of selection terminals (711 to 712, 713 to 714) connectable to the common terminal (70A, 70B). The plurality of matching circuits (6) is provided in a one-to-one correspondence with the plurality of transmission filters (1) and is connected between the plurality of transmission filters (1) and the plurality of selection terminals (711 to 714) of the switch (7). In plan view in a thickness direction (D1) of the mounting substrate (130), the plurality of transmission filters (1) is located between the output matching circuit (4) and the matching circuit (6).

The radio-frequency module (100; 100*a*; 100*b*; 100*c*; 100*d*; 100*e*) according to the sixth aspect is capable of suppressing the electromagnetic coupling between the output matching circuit (4) and each of the plurality of matching circuits (6).

In a radio-frequency module (100; 100*a*; 100*b*; 100*c*; 100*d*; 100*e*) according to a seventh aspect, in the sixth aspect, the output matching circuit (4) includes an inductor (L42) adjacent to at least one of the plurality of transmission filters (1) in plan view in the thickness direction (D1) of the mounting substrate (130). A substrate (110) of each of the plurality of transmission filters (1) is a silicon substrate. A winding axis (420) of the inductor (L42) is set along the thickness direction (D1) of the mounting substrate (130).

With the radio-frequency module (100; 100*a*; 100*b*; 100*c*; 100*d*; 100*e*) according to the seventh aspect, it is possible to suppress a decrease in the quality factor of the inductor (L42).

A radio-frequency module (100; 100*a*; 100*b*; 100*c*; 100*d*; 100*e*) according to an eighth aspect, in the sixth or seventh aspect, includes an IC chip (180) including a low-noise amplifier (18) and a switch (7). The IC chip (180) is disposed on the second major surface (132) of the mounting substrate (130). The first IC chip (180) does not overlap the plurality of transmission filters (1) in plan view in the thickness direction (D1) of the mounting substrate (130).

The radio-frequency module (100; 100*a*; 100*b*; 100*c*; 100*d*; 100*e*) according to the eighth aspect is capable of suppressing the influence of the heat of the plurality of transmission filters (1) on the IC chip (180) while reducing its size.

A radio-frequency module (100; 100*a*; 100*b*; 100*c*; 100*d*; 100*e*) according to a ninth aspect, in the eighth aspect, further includes a second IC chip (55) different from a first IC chip that is the IC chip (180). The second IC chip (55) includes a second switch (5) different from a first switch that is the switch (7), and a controller (19) that controls the power amplifier (3). The second IC chip (55) is mounted on the second major surface (132) of the mounting substrate (130). At least one of the plurality of transmission filters (1) overlaps the second IC chip (55) in plan view in the thickness direction (D1) of the mounting substrate (130).

The radio-frequency module (100; 100*a*; 100*b*; 100*c*; 100*d*; 100*e*) according to the ninth aspect is capable of reducing its size.

In a radio-frequency module (100*a*) according to a tenth aspect, in any one of the fifth to ninth aspects, the power amplifier (3) is mounted on the first major surface (131) of the mounting substrate (130). A major surface (39) of the power amplifier (3) on an opposite side to the mounting substrate (130) side is in contact with the shield layer (16).

With the radio-frequency module (100*a*) according to the tenth aspect, the heat generated in the power amplifier (3) is easily dissipated through the shield layer (16).

A radio-frequency module (100*d*) according to an eleventh aspect, in any one of the first to tenth aspects, further includes a receiving circuit and a shield member (29). The receiving circuit includes a receiving filter (2) mounted on the first major surface (131) of the mounting substrate (130). The shield member (29) is disposed on the first major surface (131) of the mounting substrate (130) and is disposed between the receiving circuit and the plurality of transmission filters (1) in plan view in the thickness direction (D1) of the mounting substrate (130). The shield layer (16) covers the shield member (29). The shield member (29) is in contact with the shield layer (16).

With the radio-frequency module (100*d*) according to the eleventh aspect, the characteristics of the receiving circuit are insusceptible to the plurality of transmission filters (1).

A communication device (300) according to a twelfth aspect includes the radio-frequency module (100; 100*a*; 100*b*; 100*c*; 100*d*; 100*e*) according to any one of the first to eleventh aspects, and a signal processing circuit (301). The signal processing circuit (301) is connected to the radio-frequency module (100; 100*a*; 100*b*; 100*c*; 100*d*; 100*e*).

With the communication device (300) according to the twelfth aspect, it is possible to improve the heat dissipation capability.

1 transmission filter
11 first transmission filter
12 second transmission filter

13 third transmission filter
14 fourth transmission filter
102 major surface
103 outer peripheral surface
110 substrate
111 first major surface
112 second major surface
1120 grinding mark
114 low acoustic velocity film
115 piezoelectric layer
116 interdigital transducer electrode
117 electrically insulating layer
118 spacer layer
119 cover member
120 terminal
2 receiving filter
21 first receiving filter
22 second receiving filter
23 third receiving filter
24 fourth receiving filter
25 fifth receiving filter
26 sixth receiving filter
3 power amplifier
31 driver stage amplifier
32A final stage amplifier
32B final stage amplifier
33 unbalance-balance conversion circuit (first balun)
331 unbalanced terminal
332A balanced terminal
332B balanced terminal
39 major surface
4 output matching circuit
41 balance-unbalance conversion circuit (second balun)
411A balanced terminal
411B balanced terminal
412 unbalanced terminal
42 circuit element
15 resin layer (first resin layer)
151 major surface
153 outer peripheral surface
16 shield layer
20 second resin layer
201 major surface
203 outer peripheral surface
5 second switch
50 common terminal
51 selection terminal
511 to 514 selection terminal
55 second IC chip
6 matching circuit (first matching circuit)
61 to 64 matching circuit
7 switch (first switch)
70 common terminal
71 selection terminal
711 to 716 selection terminal
8 matching circuit (second matching circuit)
9 external connection terminal
91 signal input terminal
92 signal output terminal
93 control terminal
94A antenna terminal
94B antenna terminal
94C antenna terminal
95 ground terminal
17 input matching circuit
171 first input matching circuit
172 second input matching circuit

173 third input matching circuit
174 fourth input matching circuit
175 fifth input matching circuit
176 sixth input matching circuit
18 low-noise amplifier
180 IC chip (first IC chip)
19 controller
100, 100*a*, 100*b*, 100*c*, 100*d*, 100*e* radio-frequency module
130 mounting substrate
131 first major surface
132 second major surface
133 outer peripheral surface
140 metal member
141 major surface
142 major surface
143 outer peripheral surface
300 communication device
301 signal processing circuit
302 RF signal processing circuit
303 baseband signal processing circuit
A1 antenna (first antenna)
A2 antenna (second antenna)
A3 antenna (third antenna)
C1 capacitor
D1 thickness direction
L1 inductor element
L2 inductor element
L3 inductor element
L4 inductor element
L10 primary inductor
L11 secondary inductor
L42 inductor
La1 inductor element
La2 inductor element
Lc1 inductor element
Lc2 inductor element
S1 space
T1 first transformer
T2 second transformer
Vcc1 voltage
W1 wire
W2 wire

The invention claimed is:

1. A radio-frequency module comprising:
a mounting substrate having a first major surface and a second major surface opposite to each other;
a plurality of transmission filters mounted on the first major surface of the mounting substrate;
a resin layer disposed on the first major surface of the mounting substrate and covering at least part of an outer peripheral surface of each of the plurality of transmission filters; and
a shield layer covering the resin layer and at least part of each of the plurality of transmission filters, wherein
at least part of a major surface of each of at least two transmission filters of the plurality of transmission filters on an opposite side to the mounting substrate side is in contact with the shield layer.

2. A radio-frequency module comprising:
a mounting substrate having a first major surface and a second major surface opposite to each other;
a plurality of transmission filters mounted on the first major surface of the mounting substrate;
a plurality of metal members disposed on a major surface of each of the transmission filters on an opposite side to the mounting substrate side;

a resin layer disposed on the first major surface of the mounting substrate and covering at least part of an outer peripheral surface of each of the plurality of transmission filters and at least part of an outer peripheral surface of each of the plurality of metal members; and
a shield layer covering the resin layer and at least part of each of the plurality of metal members, wherein
the plurality of metal members is in contact with the shield layer and major surfaces of corresponding ones of the plurality of transmission filters on an opposite side to the mounting substrate side.

3. The radio-frequency module according to claim 1, wherein
the major surface of each of the plurality of transmission filters has a grinding mark.

4. The radio-frequency module according to claim 3, wherein
each of the plurality of transmission filters has a substrate, and
each of the plurality of substrates is a silicon substrate, or each of the plurality of substrates is a lithium tantalate substrate, or each of the plurality of substrates is a lithium niobate substrate.

5. The radio-frequency module according to claim 1, further comprising:
a power amplifier mounted on the mounting substrate;
an output matching circuit connected to an output terminal of the power amplifier;
a low-noise amplifier mounted on the mounting substrate; and
an input matching circuit connected to an input terminal of the low-noise amplifier, wherein
in plan view in a thickness direction of the mounting substrate, the plurality of transmission filters is located between the output matching circuit and the input matching circuit.

6. The radio-frequency module according to claim 1, further comprising:
a power amplifier mounted on the mounting substrate;
an output matching circuit connected to an output terminal of the power amplifier;
a low-noise amplifier mounted on the mounting substrate;
an antenna terminal disposed on the mounting substrate;
a first switch mounted on the mounting substrate, the first switch having a common terminal connected to the antenna terminal and a plurality of selection terminals connectable to the common terminal; and
a plurality of matching circuits provided in a one-to-one correspondence with the plurality of transmission filters and connected between the plurality of transmission filters and the plurality of selection terminals of the first switch, wherein
in plan view in a thickness direction of the mounting substrate, the plurality of transmission filters is located between the output matching circuit and the plurality of matching circuits.

7. The radio-frequency module according to claim 6, wherein
the output matching circuit includes an inductor adjacent to at least one transmission filter of the plurality of transmission filters in plan view in the thickness direction of the mounting substrate,
a substrate of each of the plurality of transmission filters is a silicon substrate, and
a winding axis of the inductor is set along the thickness direction of the mounting substrate.

8. The radio-frequency module according to claim 6, further comprising a first IC chip including the low-noise amplifier and the first switch, wherein the first IC chip is mounted on the second major surface of the mounting substrate, and in plan view in the thickness direction of the mounting substrate, the first IC chip does not overlap the plurality of transmission filters.

9. The radio-frequency module according to claim 8, further comprising a second IC chip different from the first IC chip, wherein the second IC chip includes a second switch different from the first switch, and a controller configured to control the power amplifier, the second IC chip is mounted on the second major surface of the mounting substrate, and in plan view in the thickness direction of the mounting substrate, at least one of the plurality of transmission filters overlaps the second IC chip.

10. The radio-frequency module according to claim 5, wherein the power amplifier is mounted on the first major surface of the mounting substrate, and a major surface of the power amplifier on an opposite side to the mounting substrate side is in contact with the shield layer.

11. The radio-frequency module according to claim 1, further comprising:

a receiving circuit including a receiving filter mounted on the first major surface of the mounting substrate; and a shield member disposed on the first major surface of the mounting substrate and, in plan view in a thickness direction of the mounting substrate, disposed between the receiving circuit and the plurality of transmission filters, wherein the shield layer covers the shield member, and the shield member is in contact with the shield layer.

12. A communication device comprising:

the radio-frequency module according to claim 1; and a signal processing circuit connected to the radio-frequency module.

13. The radio-frequency module according to claim 2, wherein the major surface of each of the plurality of transmission filters has a grinding mark.

14. The radio-frequency module according to claim 2, further comprising:

a power amplifier mounted on the mounting substrate;

an output matching circuit connected to an output terminal of the power amplifier;

a low-noise amplifier mounted on the mounting substrate; and an input matching circuit connected to an input terminal of the low-noise amplifier, wherein in plan view in a thickness direction of the mounting substrate, the plurality of transmission filters is located between the output matching circuit and the input matching circuit.

15. The radio-frequency module according to claim 3, further comprising:

a power amplifier mounted on the mounting substrate;

an output matching circuit connected to an output terminal of the power amplifier;

a low-noise amplifier mounted on the mounting substrate; and an input matching circuit connected to an input terminal of the low-noise amplifier, wherein in plan view in a thickness direction of the mounting substrate, the plurality of transmission filters is located between the output matching circuit and the input matching circuit.

16. The radio-frequency module according to claim 4, further comprising:

a power amplifier mounted on the mounting substrate;

an output matching circuit connected to an output terminal of the power amplifier;

a low-noise amplifier mounted on the mounting substrate; and an input matching circuit connected to an input terminal of the low-noise amplifier, wherein in plan view in a thickness direction of the mounting substrate, the plurality of transmission filters is located between the output matching circuit and the input matching circuit.

17. The radio-frequency module according to claim 2, further comprising:

a power amplifier mounted on the mounting substrate;

an output matching circuit connected to an output terminal of the power amplifier;

a low-noise amplifier mounted on the mounting substrate;

an antenna terminal disposed on the mounting substrate;

a first switch mounted on the mounting substrate, the first switch having a common terminal connected to the antenna terminal and a plurality of selection terminals connectable to the common terminal; and a plurality of matching circuits provided in a one-to-one correspondence with the plurality of transmission filters and connected between the plurality of transmission filters and the plurality of selection terminals of the first switch, wherein in plan view in a thickness direction of the mounting substrate, the plurality of transmission filters is located between the output matching circuit and the plurality of matching circuits.

18. The radio-frequency module according to claim 3, further comprising:

a power amplifier mounted on the mounting substrate;

an output matching circuit connected to an output terminal of the power amplifier;

a low-noise amplifier mounted on the mounting substrate;

an antenna terminal disposed on the mounting substrate;

a first switch mounted on the mounting substrate, the first switch having a common terminal connected to the antenna terminal and a plurality of selection terminals connectable to the common terminal; and a plurality of matching circuits provided in a one-to-one correspondence with the plurality of transmission filters and connected between the plurality of transmission filters and the plurality of selection terminals of the first switch, wherein in plan view in a thickness direction of the mounting substrate, the plurality of transmission filters is located between the output matching circuit and the plurality of matching circuits.

19. The radio-frequency module according to claim 4, further comprising:

a power amplifier mounted on the mounting substrate;

an output matching circuit connected to an output terminal of the power amplifier;

a low-noise amplifier mounted on the mounting substrate;

an antenna terminal disposed on the mounting substrate;

a first switch mounted on the mounting substrate, the first switch having a common terminal connected to the antenna terminal and a plurality of selection terminals connectable to the common terminal; and a plurality of matching circuits provided in a one-to-one correspondence with the plurality of transmission filters and connected between the plurality of transmission filters and the plurality of selection terminals of the first switch, wherein in plan view in a thickness direction of the mounting substrate, the plurality of transmission filters is located between the output matching circuit and the plurality of matching circuits.

20. The radio-frequency module according to claim 7, further comprising a first IC chip including the low-noise amplifier and the first switch, wherein the first IC chip is mounted on the second major surface of the mounting substrate, and in plan view in the thickness direction of the mounting substrate, the first IC chip does not overlap the plurality of transmission filters.

* * * * *